(12) United States Patent
Goto et al.

(10) Patent No.: US 12,712,517 B2
(45) **Date of Patent: *Aug. 18, 2026**

(54) SURFACE ACOUSTIC WAVE DEVICES WITH HIGH ELECTROMECHANICAL COUPLING COEFFICIENT AND THERMAL STABILITY

(71) Applicant: Skyworks Solutions, Inc., Irvine, CA (US)

(72) Inventors: Rei Goto, Osaka (JP); Hironori Fukuhara, Ibaraki (JP); Benjamin Paul Abbott, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 278 days.

This patent is subject to a terminal disclaimer.

(21) Appl. No.: 18/477,439

(22) Filed: Sep. 28, 2023

(65) Prior Publication Data

US 2024/0113680 A1 Apr. 4, 2024

Related U.S. Application Data

(60) Provisional application No. 63/377,678, filed on Sep. 29, 2022, provisional application No. 63/377,679, filed on Sep. 29, 2022.

(51) Int. Cl.
*H03H 9/02* (2006.01)
*H03H 9/05* (2006.01)
(Continued)

(52) U.S. Cl.
CPC .... *H03H 9/02559* (2013.01); *H03H 9/02574* (2013.01); *H03H 9/058* (2013.01);
(Continued)

(58) Field of Classification Search
CPC ........... H03H 9/02559; H03H 9/02574; H03H 9/058; H03H 9/14541; H03H 9/14544; H03H 9/6483; H04B 1/40
See application file for complete search history.

(56) References Cited

U.S. PATENT DOCUMENTS 7,576,471 B1 8/2009 Solal
7,939,987 B1 5/2011 Solal et al.
(Continued)

FOREIGN PATENT DOCUMENTS

WO WO 2017/161303 9/2017

OTHER PUBLICATIONS

Mimura et al., "Low Acoustic Velocity Rayleigh SAW Technology for Miniaturization of High Performance TC-SAW Devices," Seventh International Symposium on Acoustic Wave Devices for Future Mobile Communication Systems., 2018.
(Continued)

*Primary Examiner* — Samuel S Outten
(74) *Attorney, Agent, or Firm* — VIA LLP

(57) ABSTRACT

An acoustic wave device configured to generate a surface acoustic wave having a wavelength L is disclosed. The acoustic wave device can include a substrate, a piezoelectric layer that includes lithium niobate, an interdigital transducer electrode, an overcoat dielectric layer, and/or a raised frame structure. The piezoelectric layer can have a trench in an edge region within 0.25L and 0.45L from an edge of an active region where the surface acoustic wave is generated. The piezoelectric layer is disposed at least partially between the substrate and the interdigital transducer electrode. The overcoat dielectric layer is positioned over the interdigital transducer electrode. The raised frame structure is positioned over the overcoat dielectric layer. The raised frame structure is positioned in an edge region of the active region. The acoustic wave device can include a trap-rich layer over the substrate and an intervening dielectric layer over the trap-rich layer.

20 Claims, 26 Drawing Sheets

(51) Int. Cl.

*H03H 9/145* (2006.01)
*H03H 9/64* (2006.01)
*H04B 1/40* (2015.01)

(52) U.S. Cl.

CPC .... *H03H 9/14541* (2013.01); *H03H 9/14544* (2013.01); *H03H 9/6483* (2013.01); *H04B 1/40* (2013.01); *H03H 9/02818* (2013.01); *H03H 9/02992* (2013.01)

(56) References Cited

U.S. PATENT DOCUMENTS

| | | | | |
|---|---|---|---|---|
| 8,294,331 | B2 | 10/2012 | Abbott et al. | |
| 8,741,683 | B2 | 6/2014 | Huang et al. | |
| 10,090,825 | B2 | 10/2018 | Kuroyanagi | |
| 11,368,137 | B2 | 6/2022 | Goto et al. | |
| 12,136,910 | B2 | 11/2024 | Goto | |
| 2003/0020366 | A1 | 1/2003 | Kando | |
| 2011/0068655 | A1 | 3/2011 | Solal et al. | |
| 2012/0161577 | A1 | 6/2012 | Abbott et al. | |
| 2013/0051588 | A1 | 2/2013 | Ruile et al. | |
| 2013/0249647 | A1* | 9/2013 | Nakanishi | H03H 9/02881 333/186 |
| 2014/0285287 | A1* | 9/2014 | Komatsu | H03H 9/02858 333/195 |
| 2015/0243873 | A1 | 8/2015 | Nakanishi et al. | |
| 2016/0149553 | A1 | 5/2016 | Yoon et al. | |
| 2017/0170808 | A1* | 6/2017 | Iwaki | H03H 9/14532 |
| 2017/0331451 | A1 | 11/2017 | Yoon et al. | |
| 2018/0054179 | A1 | 2/2018 | Gamble et al. | |
| 2018/0097508 | A1 | 4/2018 | Iwamoto et al. | |
| 2018/0269852 | A1 | 9/2018 | Daimon et al. | |
| 2019/0089328 | A1 | 3/2019 | Unterreithmeier | |
| 2019/0288664 | A1* | 9/2019 | Saji | H03H 9/02866 |
| 2019/0356296 | A1 | 11/2019 | Mimura | |
| 2020/0212876 | A1 | 7/2020 | Goto et al. | |
| 2020/0328727 | A1 | 10/2020 | Daimon | |
| 2020/0373903 | A1* | 11/2020 | Turner | H03H 9/02125 |
| 2020/0389151 | A1 | 12/2020 | Goto | |
| 2021/0159886 | A1* | 5/2021 | Goto | H03H 9/25 |
| 2022/0286105 | A1 | 9/2022 | Goto et al. | |
| 2024/0113679 | A1 | 4/2024 | Goto et al. | |
| 2025/0030401 | A1 | 1/2025 | Goto | |

OTHER PUBLICATIONS

Nakamura et al., "Suppression Mechanism of Transverse-Mode Spurious Responses in SAW Resonators on a SiO2/Al/LiNbO3 Structure", IEEE International Ultrasonics Symposium Proceedings, 2011.

* cited by examiner hMo=0.01L hMo=0.03L hMo=0.05L

SiO2 FRAME h 0.12L w 0.50L
SiO2 FRAME h 0.14L w 0.50L
SiO2 FRAME h 0.16L w 0.50L

SiO2 FRAME h 0.12L w 0.50L
SiO2 FRAME h 0.14L w 0.50L
SiO2 FRAME h 0.16L w 0.50L

SiO2 FRAME h 0.12L w 0.50L
SiO2 FRAME h 0.14L w 0.50L
SiO2 FRAME h 0.16L w 0.50L

SiO2 FRAME h 0.10L w 0.75L
SiO2 FRAME h 0.11L w 0.75L
SiO2 FRAME h 0.12L w 0.75L
OFFSET OF 0.2L

SiO2 FRAME h 0.10L w 0.75L
SiO2 FRAME h 0.11L w 0.75L
SiO2 FRAME h 0.12L w 0.75L
OFFSET OF 0.2L

SiO2 FRAME h 0.10L w 0.75L
SiO2 FRAME h 0.11L w 0.75L
SiO2 FRAME h 0.12L w 0.75L
OFFSET OF 0.2L

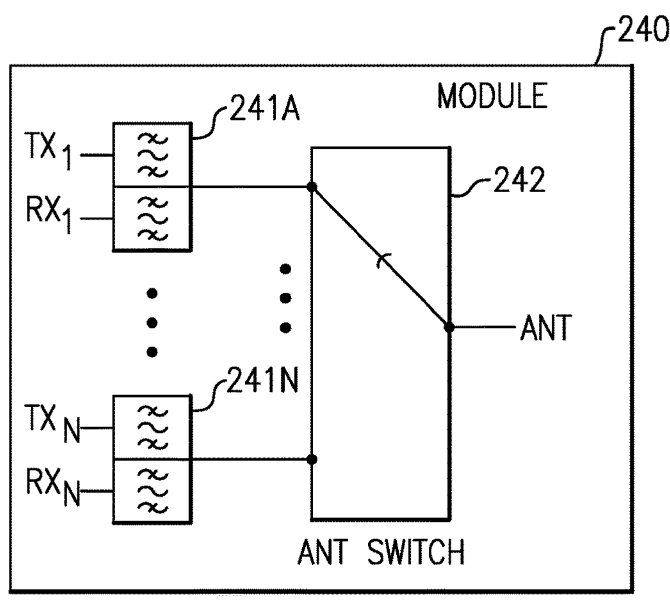
FIG.54
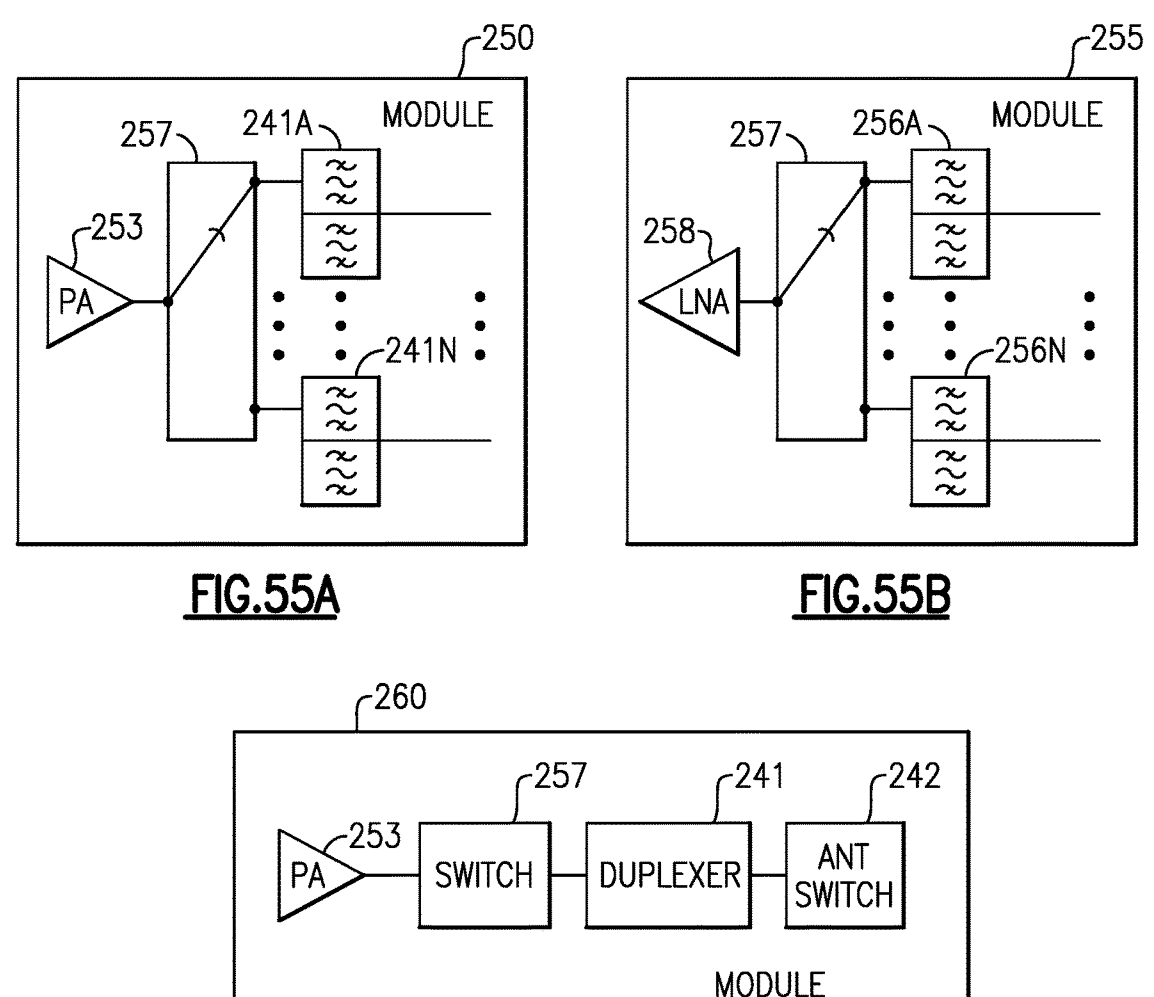
FIG.55A
FIG.55B
FIG.56

SURFACE ACOUSTIC WAVE DEVICES WITH HIGH ELECTROMECHANICAL COUPLING COEFFICIENT AND THERMAL STABILITY

CROSS REFERENCE TO PRIORITY APPLICATIONS

This application claims the benefit of priority U.S. Provisional Patent Application No. 63/377,678, filed Sep. 29, 2022, titled "SURFACE ACOUSTIC WAVE DEVICES WITH LITHIUM NIOBATE PIEZOELECTRIC MATERIAL," and U.S. Provisional Patent Application No. 63/377,679, filed Sep. 29, 2022, titled "SURFACE ACOUSTIC WAVE DEVICES WITH HIGH ELECTROMECHANICAL COUPLING COEFFICIENT AND THERMAL STABILITY," the contents of each of which, are hereby incorporated by reference in their entireties herein. Any and all applications for which a foreign or domestic priority claim is identified in the Application Data Sheet as filed with the present application, including U.S. Provisional Patent Application No. 63/377,678, filed Sep. 29, 2022, titled "SURFACE ACOUSTIC WAVE DEVICES WITH LITHIUM NIOBATE PIEZOELECTRIC MATERIAL," and U.S. Provisional Patent Application No. 63/377,679, filed Sep. 29, 2022, titled "SURFACE ACOUSTIC WAVE DEVICES WITH HIGH ELECTROMECHANICAL COUPLING COEFFICIENT AND THERMAL STABILITY" are hereby incorporated by reference under 37 CFR 1.57 in their entirety.

BACKGROUND

Technical Field

Embodiments of this disclosure relate to acoustic wave devices, such as surface acoustic wave devices, and more particularly to acoustic wave devices that have a piezoelectric layer that includes lithium niobate.

Description of Related Technology

Acoustic wave filters can be implemented in radio frequency electronic systems. For instance, filters in a radio frequency front end of a mobile phone can include acoustic wave filters. An acoustic wave filter can include a plurality of acoustic resonators arranged to filter a radio frequency signal. Example acoustic wave filters include surface acoustic wave (SAW) filters and bulk acoustic wave (BAW) filters. SAW filters can include SAW resonators. A SAW resonator of a surface acoustic wave filter typically includes an interdigital transducer electrode on a piezoelectric substrate. A surface acoustic wave resonator is arranged to generate a surface acoustic wave.

Although various SAW devices exist, there remains a need for improved SAW devices and filters.

SUMMARY

The innovations described in the claims each have several aspects, no single one of which is solely responsible for its desirable attributes. Without limiting the scope of the claims, some prominent features of this disclosure will now be briefly described.

In some aspects, the techniques described herein relate to an acoustic wave device including: a substrate; a piezoelectric layer that includes lithium niobate; an interdigital transducer electrode including a plurality of interdigitated fingers separated by gaps. The piezoelectric layer can be disposed between the substrate and the interdigital transducer electrode. The device can include an overcoat layer that includes silicon dioxide. The interdigital transducer electrode can be disposed between the piezoelectric layer and the overcoat layer.

In some embodiments, the techniques described herein relate to an acoustic wave device wherein a distance L extends across two of the interdigitated fingers and two of the gaps, the overcoat layer having a height that is between about 0.05 times the distance L and about 0.35 times the distance L.

In some embodiments, the techniques described herein relate to an acoustic wave device wherein a distance L extends across two of the interdigitated fingers and two of the gaps, the overcoat layer having a height that is between about 0.15 times the distance L and about 0.25 times the distance L.

In some embodiments, the techniques described herein relate to an acoustic wave device wherein the piezoelectric layer includes R rotated Y-cut X-propagation lithium niobate with R between about 0 degrees and about 45 degrees.

In some embodiments, the techniques described herein relate to an acoustic wave device wherein the piezoelectric layer includes R rotated Y-cut X-propagation lithium niobate with R between about 15 degrees and about 40 degrees.

In some embodiments, the techniques described herein relate to an acoustic wave device wherein the piezoelectric layer includes R rotated Y-cut X-propagation lithium niobate with R of about 30 degrees.

In some embodiments, the techniques described herein relate to an acoustic wave device further including a raised frame structure, the overcoat layer disposed between the interdigital transducer electrode and the raised frame structure.

In some embodiments, the techniques described herein relate to an acoustic wave device wherein the raised frame structure includes silicon dioxide.

In some embodiments, the techniques described herein relate to an acoustic wave device wherein a distance L extends across two of the interdigitated fingers and two of the gaps, the raised frame structure having a height between about 0.08 times the distance L and about 0.16 times the distance L.

In some embodiments, the techniques described herein relate to an acoustic wave device wherein a distance L extends across two of the interdigitated fingers and two of the gaps, the raised frame structure having a height between about 0.1 times the distance L and about 0.14 times the distance L.

In some embodiments, the techniques described herein relate to an acoustic wave device wherein a distance L extends across two of the interdigitated fingers and two of the gaps, the raised frame structure having a width between about 0.5 times the distance L and about 1.5 times the distance L.

In some embodiments, the techniques described herein relate to an acoustic wave device wherein a distance L extends across two of the interdigitated fingers and two of the gaps, the raised frame structure having a width between about 0.7 times the distance L and about 0.8 times the distance L.

In some embodiments, the techniques described herein relate to an acoustic wave device including an active area where the plurality of interdigitated fingers overlap, a distance L extending across two of the interdigitated fingers and two of the gaps, the raised frame structure offset inward from an edge of the active area by an offset distance that is between about 0.05 times the distance L and about 0.3 times the distance L.

In some embodiments, the techniques described herein relate to an acoustic wave device including an active area where the plurality of interdigitated fingers overlap, a distance L extending across two of the interdigitated fingers and two of the gaps, the raised frame structure offset inward from an edge of the active area by an offset distance that is between about 0.1 times the distance L and about 0.2 times the distance L.

In some embodiments, the techniques described herein relate to an acoustic wave device wherein the interdigital transducer electrode includes a first layer and a second layer, the first layer disposed between the second layer and the piezoelectric layer, and the second layer disposed between the first layer and the overcoat layer.

In some embodiments, the techniques described herein relate to an acoustic wave device wherein the first layer includes molybdenum and the second layer includes aluminum.

In some embodiments, the techniques described herein relate to an acoustic wave device wherein the first layer includes tungsten and the second layer includes aluminum.

In some embodiments, the techniques described herein relate to an acoustic wave device wherein the first layer includes a first material and the second layer includes a second material that has a lower acoustic impedance than the first material.

In some embodiments, the techniques described herein relate to an acoustic wave device wherein a distance L extends across two of the interdigitated fingers and two of the gaps, the first layer having a height that is between about 0.01 times the distance L and about 0.08 times the distance L.

In some aspects, the techniques described herein relate to an acoustic wave device including: a substrate; a piezoelectric layer that includes R rotated Y-cut X-propagation lithium niobate with R between about 0 degrees and about 45 degrees; and an interdigital transducer electrode including a plurality of interdigitated fingers separated by gaps, the piezoelectric layer disposed between the substrate and the interdigital transducer electrode.

In some embodiments, the techniques described herein relate to an acoustic wave device wherein R is between about 15 degrees and about 40 degrees.

In some embodiments, the techniques described herein relate to an acoustic wave device wherein R is about 30 degrees.

In some embodiments, the techniques described herein relate to an acoustic wave device further including an overcoat layer disposed over the interdigital transducer electrode.

In some embodiments, the techniques described herein relate to an acoustic wave device wherein the overcoat layer includes silicon dioxide.

In some embodiments, the techniques described herein relate to an acoustic wave device wherein a distance L extends across two of the interdigitated fingers and two of the gaps, the overcoat layer having a height that is between about 0.05 times the distance L and about 0.35 times the distance L.

In some embodiments, the techniques described herein relate to an acoustic wave device further including a raised frame structure disposed over the overcoat layer.

In some embodiments, the techniques described herein relate to an acoustic wave device wherein a distance L extends across two of the interdigitated fingers and two of the gaps, the raised frame structure having a height between about 0.08 times the distance L and about 0.16 times the distance L.

In some embodiments, the techniques described herein relate to an acoustic wave device wherein a distance L extends across two of the interdigitated fingers and two of the gaps, the raised frame structure having a width between about 0.5 times the distance L and about 1.5 times the distance L.

In some embodiments, the techniques described herein relate to an acoustic wave device including an active area where the plurality of interdigitated fingers overlap, a distance L extending across two of the interdigitated fingers and two of the gaps, the raised frame structure offset inward from an edge of the active area by an offset distance that is between about 0.05 times the distance L and about 0.3 times the distance L.

In some embodiments, the techniques described herein relate to an acoustic wave device wherein the interdigital transducer electrode includes a first layer and a second layer, the first layer disposed between the second layer and the piezoelectric layer.

In some aspects, the techniques described herein relate to an acoustic wave device including: a substrate; a piezoelectric layer that includes lithium niobate; an interdigital transducer electrode including a plurality of interdigitated fingers separated by gaps, the interdigital transducer electrode having a first layer and a second layer, the first layer disposed between the second layer and the piezoelectric layer; an overcoat layer that includes silicon dioxide, the second layer of the interdigital transducer electrode disposed between the first layer of the interdigital transducer electrode and the overcoat layer; and a raised frame structure, the overcoat layer disposed between the second layer of the interdigital transducer electrode and the raised frame structure. In some embodiments, the acoustic wave device can include any combination of the features described herein, such as in the description above.

In some aspects, the techniques described herein relate to an acoustic wave device including: a substrate; a piezoelectric layer; and an interdigital transducer electrode including a plurality of interdigitated fingers separated by gaps, the piezoelectric layer disposed between the substrate and the interdigital transducer electrode, the interdigital transducer electrode having a first layer and a second layer, the first layer disposed between the second layer and the piezoelectric layer.

In some embodiments, the techniques described herein relate to an acoustic wave device wherein the first layer includes a first material and the second layer includes a second material that has a lower acoustic impedance than the first material.

In some embodiments, the techniques described herein relate to an acoustic wave device wherein the first layer includes molybdenum and the second layer includes aluminum.

In some embodiments, the techniques described herein relate to an acoustic wave device wherein the first layer includes tungsten and the second layer includes aluminum.

In some embodiments, the techniques described herein relate to an acoustic wave device wherein a distance L extends across two of the interdigitated fingers and two of the gaps, the first layer having a height that is between about 0.01 times the distance L and about 0.1 times the distance L.

In some embodiments, the techniques described herein relate to an acoustic wave device wherein a distance L extends across two of the interdigitated fingers and two of the gaps, the first layer having a height that is between about 0.02 times the distance L and about 0.08 times the distance L.

In some embodiments, the techniques described herein relate to an acoustic wave device wherein the piezoelectric layer includes lithium niobate.

In some embodiments, the techniques described herein relate to an acoustic wave device wherein the piezoelectric layer includes R rotated Y-cut X-propagation lithium niobate with R between about 0 degrees and about 45 degrees.

In some embodiments, the techniques described herein relate to an acoustic wave device further including an overcoat layer, the second layer of the interdigital transducer electrode disposed between the first layer of the interdigital transducer electrode and the overcoat layer.

In some embodiments, the techniques described herein relate to an acoustic wave device where the overcoat layer includes silicon dioxide.

In some embodiments, the techniques described herein relate to an acoustic wave device wherein a distance L extends across two of the interdigitated fingers and two of the gaps, the overcoat layer having a height that is between about 0.05 times the distance L and about 0.35 times the distance L.

In some embodiments, the techniques described herein relate to an acoustic wave device further including a raised frame structure, the overcoat layer disposed between the interdigital transducer electrode and the raised frame structure.

In some embodiments, the techniques described herein relate to an acoustic wave device wherein the raised frame structure includes silicon dioxide.

In some embodiments, the techniques described herein relate to an acoustic wave device wherein a distance L extends across two of the interdigitated fingers and two of the gaps, the raised frame structure having a height between about 0.08 times the distance L and about 0.16 times the distance L.

In some embodiments, the techniques described herein relate to an acoustic wave device wherein a distance L extends across two of the interdigitated fingers and two of the gaps, the raised frame structure having a width between about 0.5 times the distance L and about 1.5 times the distance L.

In some embodiments, the techniques described herein relate to an acoustic wave device including an active area where the plurality of interdigitated fingers overlap, a distance L extending across two of the interdigitated fingers and two of the gaps, the raised frame structure offset inward from an edge of the active area by an offset distance that is between about 0.05 times the distance L and about 0.3 times the distance L.

In some aspects, the techniques described herein relate to an acoustic wave device including: a substrate; a piezoelectric layer; a first electrode that includes a first bus bar and a first plurality of fingers extending from the first bus bar; a second electrode that includes a second bus bar and a second plurality of fingers extending from the second bus bar, the second plurality of fingers interdigitated with the first plurality of fingers to provide an active area where the first plurality of fingers overlap with the second plurality of fingers; and a raised frame structure that is offset from an edge of the active area.

In some embodiments, the techniques described herein relate to an acoustic wave device wherein a first side of one of the first plurality of fingers is spaced away from a first side of a next one of the first plurality of fingers by a distance L, an outer end of the raised frame structure offset inward from an edge of the active area by an inward offset distance that is between about 0.05 times the distance L and about 0.3 times the distance L.

In some embodiments, the techniques described herein relate to an acoustic wave device wherein a first side of one of the first plurality of fingers is spaced away from a first side of a next one of the first plurality of fingers by a distance L, an outer end of the raised frame structure offset inward from an edge of the active area by an inward offset distance that is between about 0.1 times the distance L and about 0.2 times the distance L.

In some embodiments, the techniques described herein relate to an acoustic wave device wherein a first side of one of the first plurality of fingers is spaced away from a first side of a next one of the first plurality of fingers by a distance L, an outer end of the raised frame structure offset outward from an edge of the active area by an outward offset distance that is between about 0.05 times the distance L and about 0.3 times the distance L.

In some embodiments, the techniques described herein relate to an acoustic wave device wherein a first side of one of the first plurality of fingers is spaced away from a first side of a next one of the first plurality of fingers by a distance L, an outer end of the raised frame structure offset outward from an edge of the active area by an outward offset distance that is between about 0.1 times the distance L and about 0.2 times the distance L.

In some embodiments, the techniques described herein relate to an acoustic wave device wherein the raised frame structure includes a first raised frame structure that extends along a first side of the active area in a direction that is generally orthogonal to a direction of the first plurality of fingers, and a second raised frame structure that extends along a second side of the active area opposite the first side in a direction that is generally orthogonal to a direction of the second plurality of fingers.

In some embodiments, the techniques described herein relate to an acoustic wave device wherein the piezoelectric layer includes R rotated Y-cut X-propagation lithium niobate with R between about 0 degrees and about 45 degrees.

In some embodiments, the techniques described herein relate to an acoustic wave device further including an overcoat layer, the first and second electrodes disposed between the overcoat layer and the piezoelectric layer.

In some embodiments, the techniques described herein relate to an acoustic wave device wherein the overcoat layer includes silicon dioxide.

In some embodiments, the techniques described herein relate to an acoustic wave device wherein the piezoelectric layer includes lithium niobate.

In some embodiments, the techniques described herein relate to an acoustic wave device wherein a first side of one of the first plurality of fingers is spaced away from a first side of a next one of the first plurality of fingers by a distance L, the overcoat layer having a height that is between about 0.05 times the distance L and about 0.35 times the distance L.

In some embodiments, the techniques described herein relate to an acoustic wave device further including a raised frame structure, the overcoat layer disposed between the raised frame structure and the first and second electrodes.

In some embodiments, the techniques described herein relate to an acoustic wave device wherein the raised frame structure includes silicon dioxide.

In some embodiments, the techniques described herein relate to an acoustic wave device wherein a first side of one of the first plurality of fingers is spaced away from a first side of a next one of the first plurality of fingers by a distance L, the raised frame structure having a height between about 0.08 times the distance L and about 0.16 times the distance L.

In some embodiments, the techniques described herein relate to an acoustic wave device wherein a first side of one of the first plurality of fingers is spaced away from a first side of a next one of the first plurality of fingers by a distance L, the raised frame structure having a width between about 0.5 times the distance L and about 1.5 times the distance L.

In some embodiments, the techniques described herein relate to an acoustic wave device wherein the first and second electrodes include a first layer and a second layer, the first layer disposed between the second layer and the piezoelectric layer.

In some embodiments, the techniques described herein relate to an acoustic wave device wherein the first layer includes a first material and the second layer includes a second material that has a lower acoustic impedance than the first material.

In some embodiments, the techniques described herein relate to an acoustic wave device wherein a first side of one of the first plurality of fingers is spaced away from a first side of a next one of the first plurality of fingers by a distance L, the first layer having a height that is between about 0.01 times the distance L and about 0.08 times the distance L.

In some aspects, the techniques described herein relate to an acoustic wave device including: a substrate; a piezoelectric layer; a first bus bar; a second bus bar; a first plurality of fingers extending from the first bus bar along a first direction towards the second bus bar, a distance L extending from a first side of one of the first plurality of fingers to a first side of an adjacent one of the first plurality of fingers; a second plurality of fingers extending from the second bus bar along a second direction towards the first bus bar, the second plurality of fingers interdigitated with the first plurality of fingers; a first raised frame structure that extends across the first plurality of fingers and the second plurality of fingers along a third direction that is generally orthogonal to the first direction, the first raised frame structure spaced away from ends of the second plurality of fingers in the first direction by a first distance that is between about 0.05 times the distance L and about 0.3 times the distance L; and a second raised frame structure that extends across the first plurality of fingers and the second plurality of fingers along a fourth direction that is generally orthogonal to the second direction, the second raised frame structure spaced away from ends of the first plurality of fingers in the second direction by a second distance that is between about 0.05 times the distance L and about 0.3 times the distance L. The acoustic wave device can include any combination of the features disclosed herein, such as those described above.

In some aspects, the techniques described herein relate to an acoustic wave device configured to generate a surface acoustic wave having a wavelength L, the acoustic wave device including: a substrate; a piezoelectric layer including lithium niobate; an interdigital transducer electrode, the piezoelectric layer disposed at least partially between the substrate and the interdigital transducer electrode; an overcoat dielectric layer over the interdigital transducer electrode; and a raised frame structure over the overcoat dielectric layer, the raised frame structure including a material of the overcoat dielectric layer, the raised frame structure positioned in an edge region within 0.25L and 0.45L from an edge of an active region where the surface acoustic wave is generated.

In some embodiments, the techniques described herein relate to an acoustic wave device wherein the overcoat layer has a height in a range between 0.05L and 0.35 L.

In some embodiments, the techniques described herein relate to an acoustic wave device wherein the piezoelectric layer includes R rotated Y-cut X-propagation lithium niobate with R between 0 degrees and 45 degrees.

In some embodiments, the techniques described herein relate to an acoustic wave device wherein the piezoelectric layer includes R rotated Y-cut X-propagation lithium niobate with R between about 15 degrees and about 40 degrees.

In some embodiments, the techniques described herein relate to an acoustic wave device wherein the raised frame structure has a height in a range between 0.08L and 0.16L.

In some embodiments, the techniques described herein relate to an acoustic wave device wherein the raised frame structure has a height in a range between 0.1L and 0.14L.

In some embodiments, the techniques described herein relate to an acoustic wave device wherein the raised frame structure has a width in a range between 0.5L and 1.5L.

In some embodiments, the techniques described herein relate to an acoustic wave device wherein the raised frame structure has a width in a range between 0.7L and 0.8L.

In some embodiments, the techniques described herein relate to an acoustic wave device wherein the raised frame structure is offset inward from the edge of the active region by an offset distance in a range between 0.05L and 0.3L.

In some embodiments, the techniques described herein relate to an acoustic wave device wherein the raised frame structure is offset inward from the edge of the active region by an offset distance in a range between 0.1L and 0.2L.

In some embodiments, the techniques described herein relate to an acoustic wave device wherein the interdigital transducer electrode includes a first layer and a second layer, the first layer disposed between the second layer and the piezoelectric layer, and the second layer disposed between the first layer and the overcoat layer.

In some embodiments, the techniques described herein relate to an acoustic wave device wherein the first layer includes molybdenum and the second layer includes aluminum.

In some embodiments, the techniques described herein relate to an acoustic wave device wherein the first layer includes tungsten and the second layer includes aluminum.

In some embodiments, the techniques described herein relate to an acoustic wave device wherein the first layer includes a first material and the second layer includes a second material that has a lower acoustic impedance than the first material.

In some embodiments, the techniques described herein relate to an acoustic wave device further including an intervening dielectric layer between the substrate and the piezoelectric layer, and a trap-rich layer between the substrate and the intervening dielectric layer.

In some aspects, the techniques described herein relate to an acoustic wave device configured to generate a surface acoustic wave having a wavelength L, the acoustic wave device including: a multilayer piezoelectric substrate including a support substrate and a piezoelectric layer, the piezoelectric layer including lithium niobate; an interdigital transducer electrode formed with the piezoelectric layer; an overcoat dielectric layer over the interdigital transducer electrode, the overcoat dielectric layer including silicon oxide; and a raised frame structure over the overcoat dielectric layer, the raised frame structure unitary formed with the overcoat dielectric layer, the raised frame structure positioned in an edge region within 0.25L and 0.45L from an edge of an active region where the surface acoustic wave is generated.

In some embodiments, the techniques described herein relate to an acoustic wave device wherein the raised frame structure has a height in a range between 0.08L and 0.16L.

In some embodiments, the techniques described herein relate to an acoustic wave device wherein the multilayer piezoelectric substrate further includes an intervening dielectric layer between the support substrate and the piezoelectric layer.

In some aspects, the techniques described herein relate to a radio frequency device including: an acoustic wave device configured to generate a surface acoustic wave having a wavelength L, the acoustic wave device including a piezoelectric layer including lithium niobate, an interdigital transducer electrode over the piezoelectric layer, an overcoat dielectric layer over the interdigital transducer electrode, and a raised frame structure over the overcoat dielectric layer, the raised frame structure including a material of the overcoat dielectric layer, the raised frame structure positioned in an edge region within 0.25L and 0.45L from an edge of an active region where the surface acoustic wave is generated; and an antenna electrically coupled with the acoustic wave device.

In some embodiments, the techniques described herein relate to a radio frequency device wherein the raised frame structure has a height in a range between 0.08L and 0.16L and the raised frame structure is offset from the edge of the active region.

In some aspects, the techniques described herein relate to an acoustic wave device configured to generate a surface acoustic wave having a wavelength L, the acoustic wave device including: a substrate; a piezoelectric layer including lithium niobate, the piezoelectric layer having a trench in an edge region within 0.25L and 0.45L from an edge of an active region where the surface acoustic wave is generated; an interdigital transducer electrode, the piezoelectric layer disposed at least partially between the substrate and the interdigital transducer electrode; an overcoat dielectric layer over the interdigital transducer electrode; and a raised frame structure over the overcoat dielectric layer, the raised frame structure positioned in the edge region of the active region.

In some embodiments, the techniques described herein relate to an acoustic wave device wherein the raised frame structure includes a material of the overcoat dielectric layer.

In some embodiments, the techniques described herein relate to an acoustic wave device wherein the overcoat layer has a height in a range between 0.05L and 0.35 L.

In some embodiments, the techniques described herein relate to an acoustic wave device wherein the piezoelectric layer includes R rotated Y-cut X-propagation lithium niobate with R between 0 degrees and 45 degrees.

In some embodiments, the techniques described herein relate to an acoustic wave device wherein the piezoelectric layer includes R rotated Y-cut X-propagation lithium niobate with R between about 15 degrees and about 40 degrees.

In some embodiments, the techniques described herein relate to an acoustic wave device wherein the raised frame structure has a height in a range between 0.08L and 0.16L.

In some embodiments, the techniques described herein relate to an acoustic wave device wherein the raised frame structure has a height in a range between 0.1L and 0.14L.

In some embodiments, the techniques described herein relate to an acoustic wave device wherein the raised frame structure has a width in a range between 0.5L and 1.5L.

In some embodiments, the techniques described herein relate to an acoustic wave device wherein the raised frame structure has a width in a range between 0.7L and 0.8L.

In some embodiments, the techniques described herein relate to an acoustic wave device wherein the raised frame structure is offset inward from the edge of the active region by an offset distance in a range between 0.05L and 0.3L.

In some embodiments, the techniques described herein relate to an acoustic wave device wherein the raised frame structure is offset inward from the edge of the active region by an offset distance in a range between 0.1L and 0.2L.

In some embodiments, the techniques described herein relate to an acoustic wave device wherein the interdigital transducer electrode includes a first layer and a second layer, the first layer disposed between the second layer and the piezoelectric layer, and the second layer disposed between the first layer and the overcoat layer.

In some embodiments, the techniques described herein relate to an acoustic wave device wherein the first layer includes molybdenum and the second layer includes aluminum.

In some embodiments, the techniques described herein relate to an acoustic wave device wherein the first layer includes tungsten and the second layer includes aluminum.

In some embodiments, the techniques described herein relate to an acoustic wave device further including an intervening dielectric layer between the substrate and the piezoelectric layer, and a trap-rich layer between the substrate and the intervening dielectric layer.

In some aspects, the techniques described herein relate to an acoustic wave device configured to generate a surface acoustic wave having a wavelength L, the acoustic wave device including: a multilayer piezoelectric substrate including a support substrate, a trap-rich layer over the support substrate, an intervening dielectric layer over the trap-rich layer, and a piezoelectric layer, the piezoelectric layer including lithium niobate; an interdigital transducer electrode formed with the piezoelectric layer; an overcoat dielectric layer over the interdigital transducer electrode, the overcoat dielectric layer including silicon oxide; and a raised frame structure over the overcoat dielectric layer, the raised frame structure positioned in an edge region within 0.25L and 0.45L from an edge of an active region where the surface acoustic wave is generated.

In some embodiments, the techniques described herein relate to an acoustic wave device wherein the piezoelectric layer has a trench in the edge region of the active region.

In some embodiments, the techniques described herein relate to an acoustic wave device wherein the raised frame structure includes a material of the overcoat dielectric layer.

In some aspects, the techniques described herein relate to a radio frequency device including: an acoustic wave device configured to generate a surface acoustic wave having a wavelength L, the acoustic wave device including a piezoelectric layer including lithium niobate, an interdigital transducer electrode over the piezoelectric layer, an overcoat dielectric layer over the interdigital transducer electrode, and a raised frame structure over the overcoat dielectric layer, the piezoelectric layer having a trench in an edge region within 0.25L and 0.45L from an edge of an active region where the surface acoustic wave is generated, the raised frame structure positioned in the edge region of the active region; and an antenna electrically coupled with the acoustic wave device.

In some embodiments, the techniques described herein relate to a radio frequency device wherein the raised frame structure has a height in a range between 0.08L and 0.16L and the raised frame structure is offset from the edge of the active region.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 54 is a schematic block diagram of a module that includes an antenna switch and duplexers that include one or more acoustic wave devices.

FIG. 55A is a schematic block diagram of a module that includes a power amplifier, a radio frequency switch, and duplexers that include one or more acoustic wave devices.

FIG. 55B is a schematic block diagram of a module that includes a low noise amplifier, a radio frequency switch, and acoustic wave filters that include one or more acoustic wave devices.

FIG. 56 is a schematic block diagram of a module that includes a power amplifier, a radio frequency switch, a duplexer that includes one or more acoustic wave devices.

DETAILED DESCRIPTION

Figure 1A:
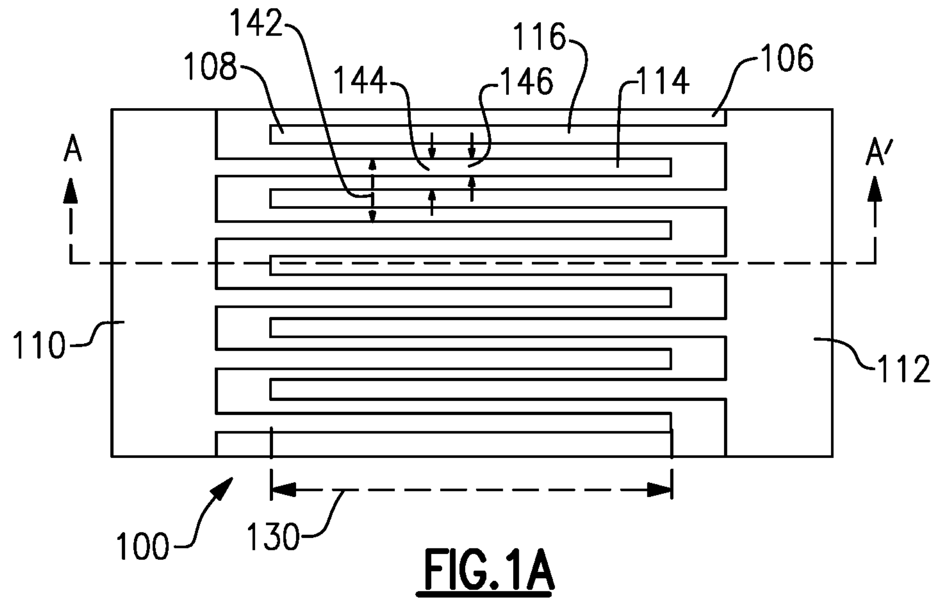
FIG. 1A is a schematic plan view of an example of an acoustic wave device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic resonators, including surface acoustic wave (SAW) and multi-layer piezoelectric substrate (MPS) resonators, can be used in radio frequency (RF) filters and communications systems. In some cases, the acoustic wave device can include a piezoelectric layer that includes lithium niobate ($LiNbO_3$), which can have an increased or improved effective electromechanical coupling coefficient ($k^2$) and a lower or worsened temperature coefficient of frequency (TCF) and/or a lower or worsened Q value, such as when compared to an acoustic wave device that has a piezoelectric layer that includes lithium tantalate ($LiTaO_3$). In some cases, a lithium niobate piezoelectric material can reduce or impede the suppression of a transverse mode, which can degrade the performance of the acoustic wave device. The acoustic wave device can include an overcoat layer, which can include silicon dioxide (SiO2), and which can be disposed over the interdigitated electrode and/or over the piezoelectric material. The overcoat layer can improve the TCF, can increase the Q value, and/or can improve suppression of the transverse mode. The acoustic wave device can include a raised frame structure, which can be configured to suppress the transverse mode. A first raised frame can be disposed along a first side of an active region and a second raised frame can be disposed along a second side of the active region. The raised frame structure can slow the edges of the active region, which can reduce or impede propagation of transverse mode. Various other structures can be used to suppress the transverse mode, such as by slowing the outer portion(s) of the active region. The interdigitated electrode can have multiple layers, in some embodiments, which can reduce the size of the acoustic wave device or filter, in some cases.

Figure 1B:
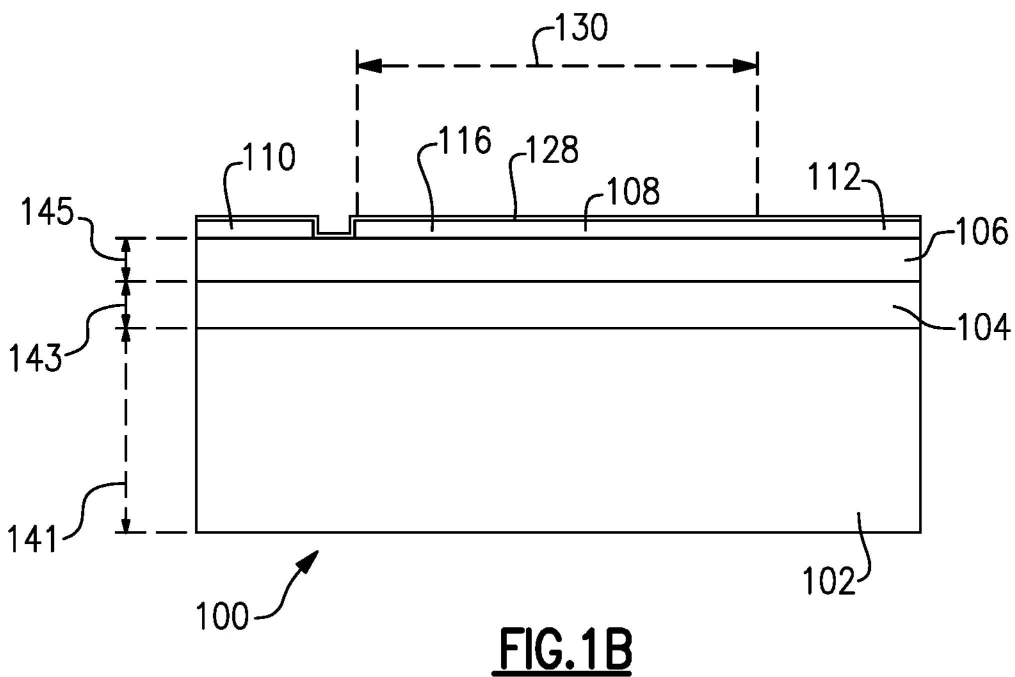
FIG. 1B is a schematic cross-sectional view of the acoustic wave device of FIG. 1A.

FIG. 1A is a schematic plan view of an example embodiment of an acoustic wave device 100, which can be a surface acoustic wave (SAW) device, such as a multi-layer piezoelectric substrate (MPS) device. FIG. 1B is a cross-sectional view of the acoustic wave device 100 of FIG. 1A taken through the line from A to A'. The device 100 can include a substrate 102, a dielectric layer 104, a piezoelectric layer 106, and an interdigital transducer (IDT) electrode 108. The dielectric layer 104 can be referred to as a functional layer or an intervening layer, in some embodiments.

The substrate 102 can be a support substrate, such as a substrate structure (e.g., a layer). The substrate 102 can include (e.g., be made of, consist of) a semiconductor material, such as silicon (Si) (e.g., high resistivity silicon). Various other suitable materials can be used for the substrate 102, such as gallium arsenide (GaAs) or various semiconductor materials. The substrate 102 can be any suitable substrate layer, such as a silicon layer, a quartz layer, a ceramic layer, a glass layer, a spinel layer, a magnesium oxide spinel layer, a sapphire layer, a diamond layer, a silicon carbide layer, a silicon nitride layer, an aluminum nitride layer, or the like. The substrate 102 can have a relatively high impedance. An acoustic impedance of the substrate 102 can be higher than an acoustic impedance of the piezoelectric layer 106. For instance, the substrate 102 can have a higher acoustic impedance than an acoustic impedance of lithium niobate and a higher acoustic impedance than lithium tantalate.

In some embodiments, a trap rich layer can be formed at, near, on, or with the substrate 102 adjacent to the dielectric layer 104. In some embodiments, the trap rich layer can mitigate the parasitic surface conductivity of the substrate 102. The trap rich layer can be formed in a number of ways, for example, by forming the surface of the substrate 102 with amorphous or polycrystalline silicon, by forming the surface of the substrate 102 with porous silicon, or by introducing defects into the surface of the substrate 102 via ion implantation, ion milling, or other methods. In some embodiments, the trap rich layer can improve the electrical characteristics of the device 100 by increasing the depth and sharpness on the anti-resonance peak.

The piezoelectric layer 106 can be a lithium based piezoelectric layer. For example, the piezoelectric layer 106 can include (e.g., be made of, consist of) lithium tantalate (LiTaO3) or lithium niobate (LiNbO3), although various other suitable piezoelectric materials could be used in some implementations. In some implementations, the substrate 102 can be formed or provided. The piezoelectric layer 106 can be formed or provided over the substrate 102 (e.g., disposed thereon, attached or adhered thereto).

In some embodiments, a dielectric layer 104 can be between the substrate 102 and the piezo electric layer 106. For example, the dielectric layer 104 can be formed or provided over the substrate 102 (e.g., disposed thereon, attached or adhered thereto), and the piezoelectric layer 106 can be formed or provided over the dielectric layer 104 (e.g., disposed thereon, attached or adhered thereto). The dielectric layer 104 can include (e.g., be made of, consist of) silicon dioxide (SiO2), silicon nitride (SiN), or silicon oxynitride (SiON), for example, although various other oxide materials or other insulating materials could be used. In some embodiments, the material of the dielectric layer 104 can have a lower acoustic impedance than the material of the piezoelectric layer 106. In some embodiments, the material of the dielectric layer 104 can have a lower acoustic impedance than the material of the IDT electrode 108. The dielectric layer 104 can enhance energy confinement and TCF tunability. In some embodiments, the dielectric layer 104 can be a single crystal layer arranged to confine acoustic energy and lower a higher frequency spurious response.

The IDT electrode 108 can be formed with (e.g., positioned at least partially within, over, or on) the piezoelectric layer 106. The IDT electrode 108 can be formed or provided over the piezoelectric layer 106 (e.g., disposed thereon, attached or adhered thereto). The IDT electrode 108 can include (e.g., be made of, consist of) aluminum (Al), molybdenum (Mo), tungsten (W), gold (Au), silver (Ag), copper (Cu), platinum (Pt), ruthenium (Ru), titanium (Ti), the like, or any suitable combination thereof, although various suitable conductive materials could be used. In some embodiments, the IDT electrode 108 can have a multilayer structure, such as a dual layer structure.

The IDT electrode 108 can have a first bus bar 110 (e.g., an input bus bar) and a second bus bar 112 (e.g., an output bus bar). The IDT electrode 108 can include a first plurality of fingers 114, which can extend from the first bus bar 110 towards the second bus bar 112. The IDT electrode 108 can include a second plurality of fingers 116, which can extend from the second bus bar 112 towards the first bus bar 110. The first fingers 114 can extend along gaps between the second fingers 116, and the second fingers 116 can extend along gaps between the first fingers 114. The fingers 114 and 116 can form an interdigitated structure. The piezoelectric layer 106 can be exposed at gaps between the fingers 114, 116. The gaps between finger 114, 116 can be filled with air, in some implementations. The gaps between fingers 114, 116 can be filled with an insulating material (e.g., silicon oxide), in some cases. The SAW device 100 can have an active region 130 where the first fingers 114 overlap the second fingers 116 along a first dimension (vertical in FIG. 1A and into the page in FIG. 1B). The active region of the SAW device 100 can be a region where a surface acoustic wave is generated or manipulated. In some embodiments, the first dimension can be parallel with a propagation direction of a wave generated by the IDT electrode 108. A first electrode can include the first bus bar 110 and the first fingers 114. A second electrode can include the second bus bar 112 and the second fingers 116.

A passivation layer 128 can be disposed over the IDT electrode 108. The passivation layer 128 can be disposed over the fingers 114, 116, and the piezoelectric layer at gaps between the fingers 114, 116, and/or over the bus bars 110, 112. The passivation layer 128 can be formed or provided over the piezoelectric layer 106 and the IDT electrode 108 (e.g., disposed thereon, attached thereto, or adhered thereto). The passivation layer 128 can include (e.g., be made of, consist of) silicon nitride (SiN), or any other suitable passivation material. The passivation layer 128 can be an insulating or dielectric material. In some embodiments, the passivation layer 128 can be omitted.

Thickness or other dimensions of various layers and/or structures of the acoustic wave device 100 can depend at least in part on one or more dimensions of the IDT electrode 108, such as of the fingers 114 and/or 116, or can depend on the primary or main resonance frequency or wavelength of the acoustic wave device 100. A distance L 142 can be taken from a side of a finger 114 to the same side of a neighboring finger 114, or from a side of a finger 116 to the same side of a neighboring finger 116. The distance 142 can also be referred to as a pitch of the first fingers 114 or a pitch of the second fingers 116. The distance L 142 can include the width of one first finger 114, the width of a gap between the first finger 114 and a second finger 116, the width of the second finger 116, and the width of a gap between the second finger 116 and a next first finger 114. The IDT electrode 108 can have a periodic structure following the pattern of first finger 114, gap, second finger 116, gap, repeating. The distance L 142 can correspond to one period of the repeating pattern of the IDT electrode 108. In some embodiments, the main resonant wavelength λ of the acoustic wave device 100 can be equal to, or influenced at least partially by, the distance L 142. The primary or main resonance frequency of the device 100 can correspond to the resonant wavelength λ.

The distance P 144 can correspond to a distance from a side of a first finger 114 to a same side of a second finger 116, or from a side of a second finger 116 to a same side of a first finger 114. The distance 144 can also be referred to as a pitch of the IDT electrode 108. The distance P 144 can include the width of one finger 114 or 116 and the width of one gap between fingers 114 and 116. In some cases, the widths of the first fingers 114 can be the same as the widths of the second fingers 116, and the distance P 144 can be half of the distance L 142. A distance D 146 can be the width of one finger 114, or one finger 116. The fingers 114 and 116 can have substantially the same width 146, although other configurations could have different widths for first fingers 114 and second fingers 116.

The substrate 102 can have a thickness or height 141, which can be greater than about 5 times the distance L 142 (>5L), although other values could be used. Acoustic properties can determine a minimum thickness for the substrate 102, and the substrate can be made of various thicknesses depending on the substrate for any particular application. The substrate 102 can have a thickness or height 141 of about 5L, about 10L, about 25L, about 50L, about 75L, about 100L, about 150L, about 200L, about 250L, about 300L, or more, or any values or ranges between any of these values, although other configurations are also possible. The dielectric layer 104 (e.g., $SiO_2$) can have a thickness or height 143 of about 0L (omitted), 0.025L, about 0.05L, about 0.075L, about 0.1L, about 0.15L, about 0.2L, about 0.25L, about 0.3L, about 0.4L, about 0.5L, about 0.6L, or more, or any values or ranges between any of these values, although other configurations are also possible. The piezoelectric layer 106 can have a thickness or height 145 of about 0.05L, about 0.075L, about 0.1L, about 0.15L, about 0.2L, about 0.25L, about 0.3L, about 0.4L, about 0.5L, about 0.6L, about 0.7L, about 0.8L, or more, or any values or ranges between any of these values, although other configurations are also possible.

Figure 2:
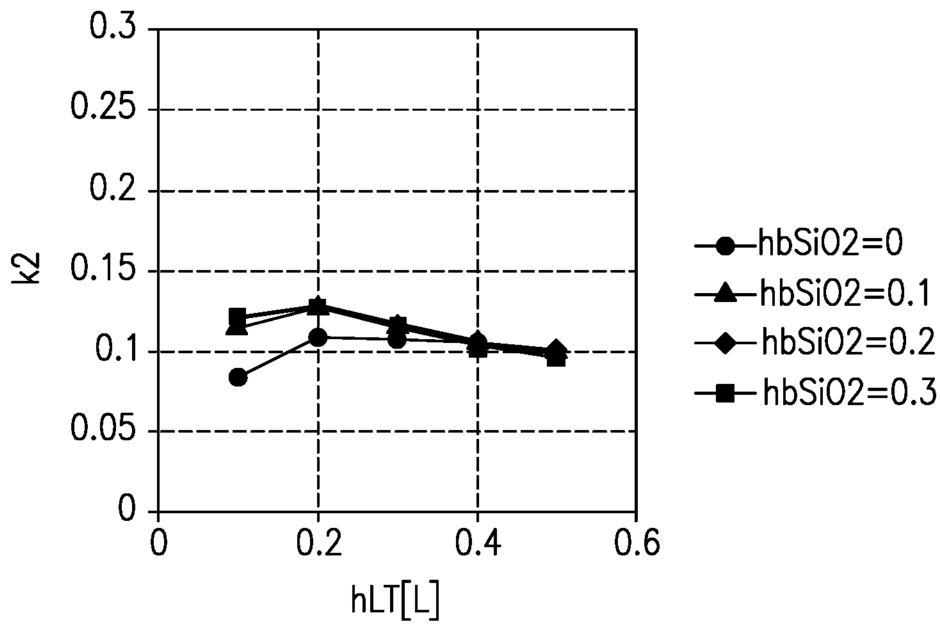
FIG. 2 shows a graph with plots of the effective electromechanical coupling coefficients ($k^2$) of various example acoustic wave devices having a lithium tantalate piezoelectric layer.

FIG. 2 shows a graph with plots of simulated effective electromechanical coupling coefficients ($k^2$) of various example acoustic wave devices 100 that include a lithium tantalate ($LiTaO_3$ or LT) piezoelectric layer as the piezoelectric layer 106. The X-axis represents the thickness of the LT piezoelectric layer, with values at 0.1L, 0.2L, 0.3L, 0.4L, and 0.5L. The different lines represent different thicknesses of the dielectric layer 104 (e.g., silicon dioxide), with values at 0 (omitted), 0.1L, 0.2L, and 0.3L. The Y-axis shows the effective electromechanical coupling coefficient ($k^2$) values. In FIG. 2, the lines for the dielectric layer 104 thicknesses of 0.2L and 0.3L closely track each other.

Figure 3:
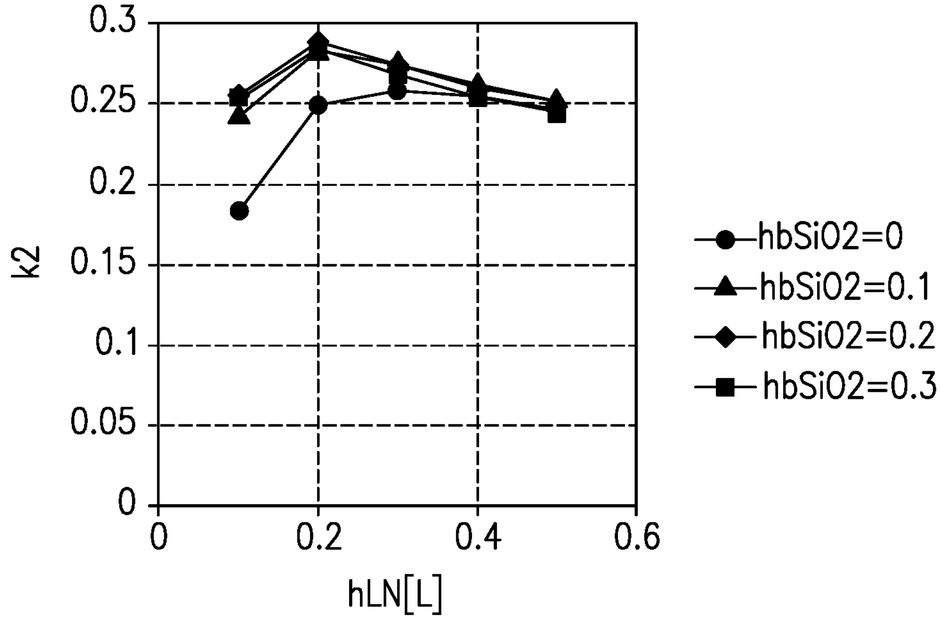
FIG. 3 shows a graph with plots of the effective electromechanical coupling coefficients ($k^2$) of various example acoustic wave devices having a lithium niobate piezoelectric layer.

FIG. 3 shows a graph with plots of simulated effective electromechanical coupling coefficients ($k^2$) of various example acoustic wave devices 100 that include a lithium niobate ($LiNbO_3$ or LN) piezoelectric layer as the piezoelectric layer 106. The X-axis represents the thickness of the LN piezoelectric layer, with values at 0.1L, 0.2L, 0.3L, 0.4L, and 0.5L. The different lines represent different thicknesses of the dielectric layer 104 (e.g., silicon dioxide), with values at 0 (omitted), 0.1L, 0.2L, and 0.3L. The Y-axis shows the effective electromechanical coupling coefficient ($k^2$) values.

FIGS. 2 and 3 can indicate that using lithium niobate (LN) instead of lithium tantalate (LT) for the piezoelectric layer 106 can increase the effective electromechanical coupling coefficient ($k^2$) of the acoustic wave device 100. In many instances, the $k^2$ more than doubled by changing the piezoelectric layer from LT to LN. By way of example, for an acoustic wave device 100 with a dielectric layer thickness of 0.2L and a piezoelectric layer thickness of 0.2L, the $k^2$ value changed from about 0.13 to 0.28 by changing the piezoelectric material from LT to LN.

Figure 4:
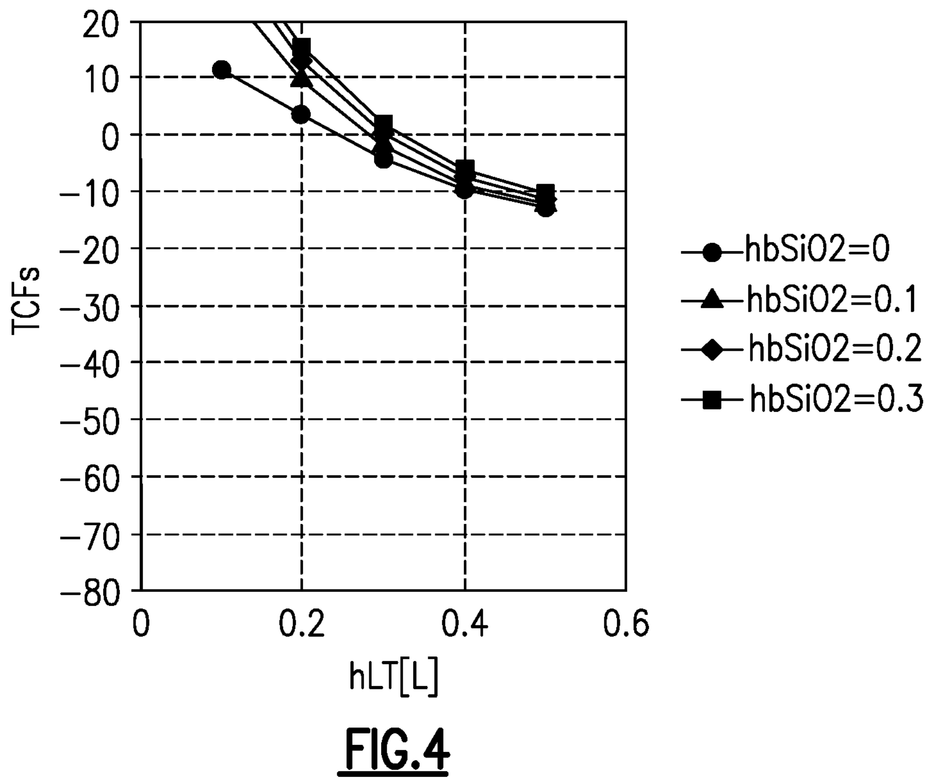
FIG. 4 shows a graph with plots of the temperature coefficients of frequency (TCF) of various example acoustic wave devices having a lithium tantalate piezoelectric layer.

FIG. 4 shows a graph with plots of simulated temperature coefficients of frequency (TCF) for various example acoustic wave devices 100 that include a lithium tantalate ($LiTaO_3$ or LT) piezoelectric layer as the piezoelectric layer 106 made of lithium tantalate ($LiTaO_3$ or LT). The X-axis represents the thickness of the LT piezoelectric layer, with values at 0.1L, 0.2L, 0.3L, 0.4L, and 0.5L. The different lines represent different thicknesses of the dielectric layer 104 (e.g., silicon dioxide), with values at 0 (omitted), 0.1L, 0.2L, and 0.3L. The Y-axis shows the temperature coefficient of frequency (TCF) values in ppm per degree C. (ppm/C).

Figure 5:
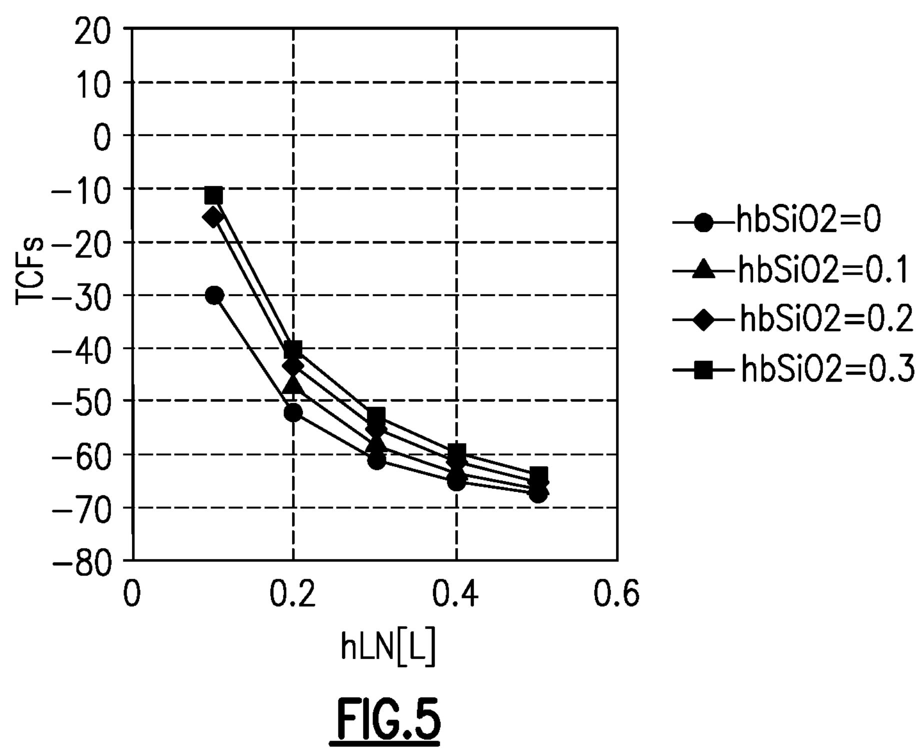
FIG. 5 shows a graph with plots of the temperature coefficients of frequency (TCF) of various example acoustic wave devices having a lithium niobate piezoelectric layer.

FIG. 5 shows a graph with plots of the temperature coefficients of frequency (TCF) for various example acoustic wave devices 100 that include a lithium niobate ($LiNbO_3$ or LN) piezoelectric layer as the piezoelectric layer 106 made of lithium niobate ($LiNbO_3$ or LN). The X-axis represents the thickness of the LN piezoelectric layer, with values at 0.1L, 0.2L, 0.3L, 0.4L, and 0.5L. The different lines represent different thicknesses of the dielectric layer 104 (e.g., silicon dioxide), with values at 0 (omitted), 0.1L, 0.2L, and 0.3L. The Y-axis shows the temperature coefficient of frequency (TCF) values in ppm per degree C. (ppm/C).

FIGS. 4 and 5 can indicate that using lithium niobate (LN) instead of lithium tantalate (LT) for the piezoelectric layer 106 can shift the temperature coefficient of frequency (TCF) lower, which can worsen the TCF. By way of example, for an acoustic wave device 100 with a dielectric layer thickness of 0.2L and a piezoelectric layer thickness of 0.2L, the TCF value changed from about +12 ppm/° C. to about −42 ppm/° C. by changing the piezoelectric material from LT to LN.

The effective electromechanical coupling coefficient ($k^2$) can relate to the efficiency of conversion between electrical energy to acoustic energy in the acoustic wave device or resonator 100. The temperature coefficient of frequency (TCF) can relate to the thermal frequency stability of the acoustic wave device or resonator 100. Accordingly, changing the piezoelectric material from lithium tantalate (LT) to lithium niobate (LN) can provide an acoustic wave device 100 that can more effectively or more efficiently transfer energy, but that is more susceptible to changes in temperature.

Figure 6:
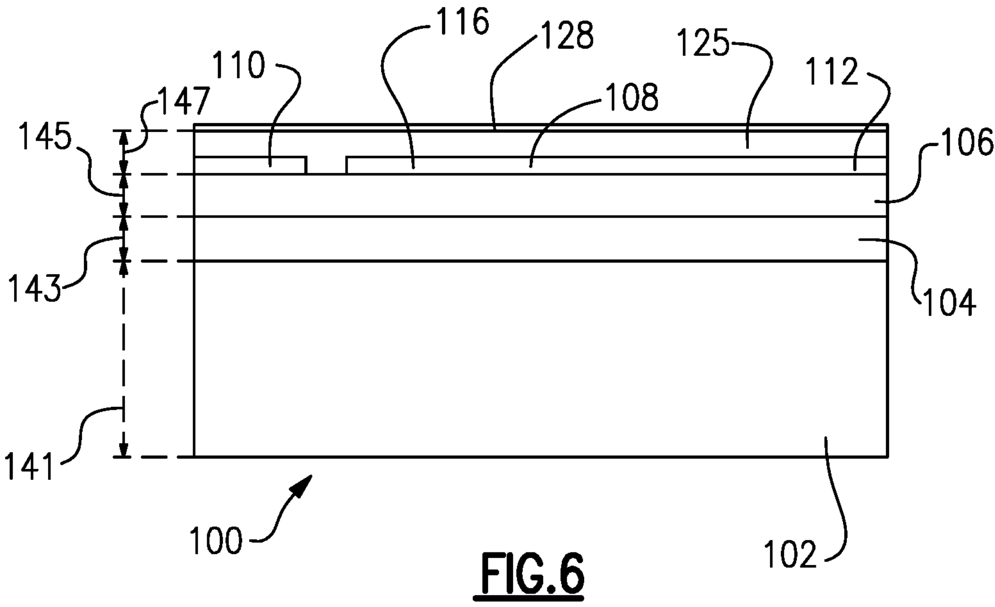
FIG. 6 is a schematic cross-sectional view of an example of an acoustic wave device.

FIG. 6 shows a schematic cross-sectional view of an example embodiment of an acoustic wave device 100, which can be similar to the acoustic wave device 100 of FIGS. 1 and 2, except as discussed herein. The acoustic wave device 100 can have an overcoat layer 125, which can be disposed over the IDT electrode 108. The overcoat layer 125 can be disposed over the fingers 114, 116, and the piezoelectric layer 106 at gaps between the fingers 114, 116, and/or over the bus bars 110, 112 (e.g., disposed thereon, attached or adhered thereto). The overcoat layer 125 can include (e.g., be made of, consist of) silicon dioxide ($SiO_2$), although other materials could be used in some implementations, such as other insulating or dielectric materials. The overcoat layer 125 can also be referred to as a temperature compensation layer. In some embodiments, the material of the overcoat layer 125 can have a lower acoustic impedance than the material of the piezoelectric layer 106. In some embodiments, the material of the overcoat layer 125 can have a lower acoustic impedance than the material of the IDT electrode 108. The overcoat layer 125 can be disposed in the gaps between fingers 114, 116 of the IDT electrode 108. The overcoat layer 125 can contact the piezoelectric layer 106, such as at the gaps between the fingers 114, 116 of the IDT electrode. The piezoelectric layer 106 and/or the IDT electrode 108 can be between the dielectric layer 104 and the overcoat layer 125 (e.g., between layers of silicon dioxide). The passivation layer 128 can be positioned over the overcoat layer 125 (e.g., disposed thereon, attached or adhered thereto). In some embodiments, the passivation layer 128 can be omitted. The overcoat layer 125 can have the effect of improving the TCF of the acoustic wave device 100, as discussed herein. The overcoat layer 125 can have the effect of reducing the $K^2$ value of the acoustic wave device 100.

Figure 7:
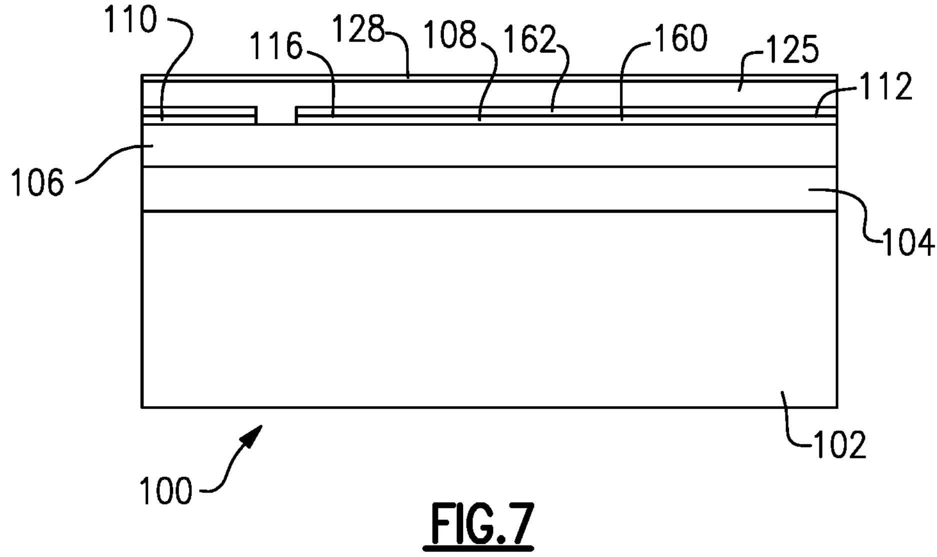
FIG. 7 is a schematic cross-sectional view of an example of an acoustic wave device.

FIG. 7 shows a schematic cross-sectional view of an example embodiment of an acoustic wave device 100, which can be similar to the acoustic wave device 100 of FIG. 6, except as discussed herein. The IDT electrode 108 can have multiple layers, such as a first layer 160 and a second layer 162. The first layer 160 of the IDT electrode 108 can be over the piezoelectric layer 106 (e.g., disposed thereon, attached or adhered thereto). The second layer 162 of the IDT electrode can be over the first layer 160 (e.g., disposed thereon, attached or adhered thereto). The first layer 160 and the second layer 162 can have the same pattern or footprint, such as with the interdigitated fingers 114, 116 and/or bus bars 110, 112, etc. The first layer 160 can include (e.g., be made of, consist of) a conductive material such as aluminum (Al), molybdenum (Mo), tungsten (W), gold (Au), silver (Ag), copper (Cu), platinum (Pt), ruthenium (Ru), titanium (Ti), or the like. The second layer 160 can include (e.g., be made of, consist of) a different conductive material such as aluminum (Al), molybdenum (Mo), tungsten (W), gold (Au), silver (Ag), copper (Cu), platinum (Pt), ruthenium (Ru), titanium (Ti), or the like. In some embodiments, the first layer 160 can include (e.g., be made of, consist of) molybdenum (Mo), and the second layer 162 can include (e.g., be made of, consist of) aluminum (Al).

Figure 8A:
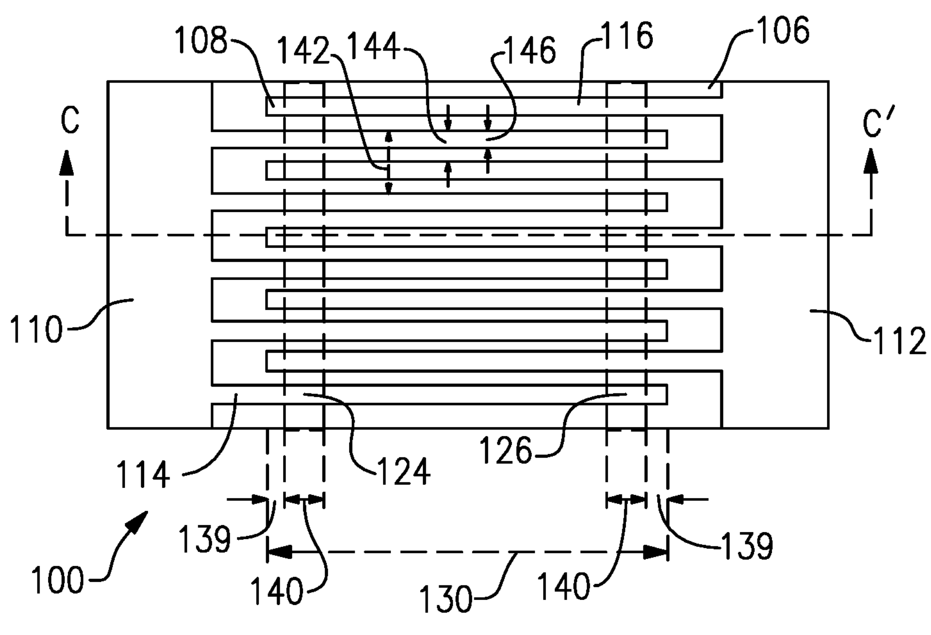
FIG. 8A is a schematic plan view of an example of an acoustic wave device.
Figure 8B:
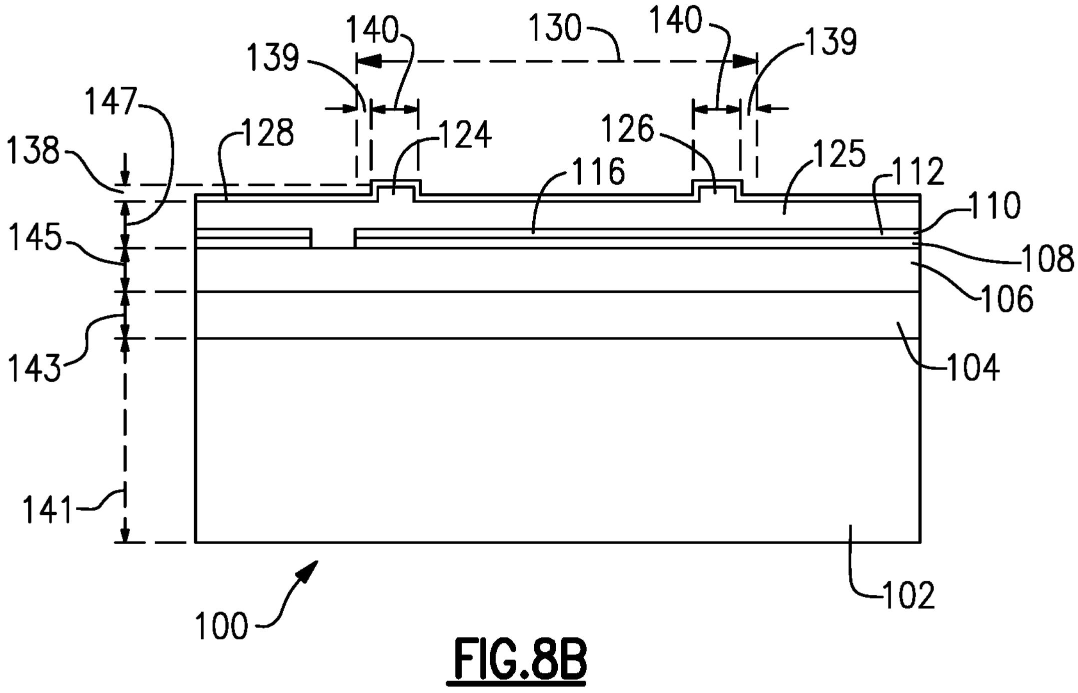
FIG. 8B is a schematic cross-sectional view of an example of an acoustic wave device.

FIG. 8A shows a schematic plan view of an example embodiment of an acoustic wave device 100, which can be similar to the acoustic wave devices 100 of FIGS. 6 and 7, except as described herein. FIG. 8B is a schematic cross-sectional view of the example acoustic wave device 100 of FIG. 8A, taken through the line from C to C'. The acoustic wave device 100 can include a raised frame structure. The raised frame structure can be disposed over the overcoat layer 125 (e.g., disposed thereon, attached or adhered thereto). A first raised frame structure 124 can extend along a first side or edge of the active area 130, and a second raised frame structure 126 can extend along a second side or edge of the active area 130. The first raised frame structure 124 can be disposed over a portion of the IDT electrode 108 at or near the first side or edge of the active area 130, and the second raised frame structure 126 can be disposed over a portion of the IDT electrode 108 at or near the second side or edge of the active area 130. In FIG. 8A, the raised frame structures 124, 126 are shown as dashed lines, and the overcoat layer (e.g., and passivation layer) are omitted from view so that the underlying IDT electrode 108 is visible. The passivation layer 128 can be conformally formed over the first and second raised frame structures 124, 126 and the overcoat layer 125.

The first raised frame structure 124 can be offset inward (e.g., toward the second raised frame structure 126) from the ends of the second fingers 116, or inward from a first end of the active area 130 by a distance 139, as discussed herein. The first raised frame structure 124 can be positioned at the ends of the second fingers 116 in some implementations. The first raised frame structure 124 can extend substantially perpendicular to the first fingers 114 and/or the second fingers 116. The first raised frame structure 124 can extend substantially parallel to the first bus bar 110. The first raised frame structure 124 can extend across multiple fingers 116. The first raised frame structure 124 can extend over the first fingers 114 and the second fingers 116, as well as the gaps therebetween.

The second raised frame structure 126 can be offset inward (e.g., towards the first raised frame structure 124) from the ends of the first fingers 114, or inward from a second end (e.g., opposite the first end) of the active area 130 by a distance 139, as discussed herein. The second raised frame structure 126 can be positioned at the ends of the first fingers 114, in some implementations. The second raised frame structure 126 can extend substantially perpendicular to the first fingers 114 and/or the second figures 116. The second raised frame structure 126 can extend substantially parallel to the second bus bar 112. The second raised frame structure 126 can extend across multiple fingers 114. The second raised frame structure 126 can extend over the first fingers 114 and the second fingers 116, as well as the gaps therebetween.

In some embodiments, the first raised frame structure 124 can be connected to the second raised frame structure 126, such as at or near one or more ends of the acoustic wave device 100. In other configurations, the first raised frame structure 124 can be separate from the second raised frame structure 126. The active area 130 can include an inner region between the raised frame structures 124, 126. The width of the active region 130 can be divided into the inner region and the raised frame portion(s). The width of the inner region can be larger than the width (e.g., combined width) of the raised frame portion(s) of the active region 130.

The raised frame structures 124, 126 can include (e.g., be made of, consist of) a low acoustic impedance material. The low acoustic impedance material can have a lower acoustic impedance than the material of the IDT electrode 108 and/or lower than the material of the piezoelectric layer 106. The density and/or acoustic impedance of the first raised frame structure 124, 126 can be lower than the density and/or acoustic impedance of the IDT electrode 108 and/or of the piezoelectric layer 106 of the device 100. The material of the raised frame structure 124, 126 can be an insulating or dielectric material. As an example, the first raised frame structures 124, 126 can be a silicon dioxide ($SiO_2$) layer. Other oxide materials can be used, and the raised frame structure 124, 126 can be an oxide raised frame structure or layer. The raised frame structure 124, 126 can be a silicon nitride (SiN) layer, a silicon carbide (SiC) layer, tantalum pentoxide ($Ta_2O_5$), or any other suitable low acoustic impedance layer. The raised frame structure 124, 126 can have a relatively low density. The raised frame structure(s) 124, 126 can be made of the same material as the overcoat layer 125 (e.g., $SiO_2$). The raised frame structure 124, 126 and the overcoat layer 125 can be unitary formed, in some embodiments. In some embodiments, the raised frame structure(s) 124, 126 can include (e.g., be made of, consist of) a conductive material, which can be insulated from the IDT electrode 108 by the overcoat layer 125 (e.g., which can be an insulating or dielectric material). The raised frame structure(s) can include one or more of the same material(s) as the IDT electrode 108, such as Al, Mo, or W, in some implementations.

Many variations are possible. In some embodiments, the IDT electrode 108 can be a single layer electrode. This embodiment would look similar to the cross-section of FIG. 8B, but with the IDT electrode 108 of FIG. 6. Stated another way, the embodiment of FIG. 6 can be modified to include the raised frame structure(s) 124, 126 of FIGS. 8A and 8B.

Acoustic wave devices 100 that include raised frame structure(s) 124, 126 can suppress spurious transverse mode (s), as compared to a similar acoustic wave device that does not include a raised frame structure. The raised frame structure(s) 124, 126 can slow down acoustic wave velocity at the edge of the active region 130, as compared to the center region, which can be beneficial for suppressing transverse modes.

Figure 9:
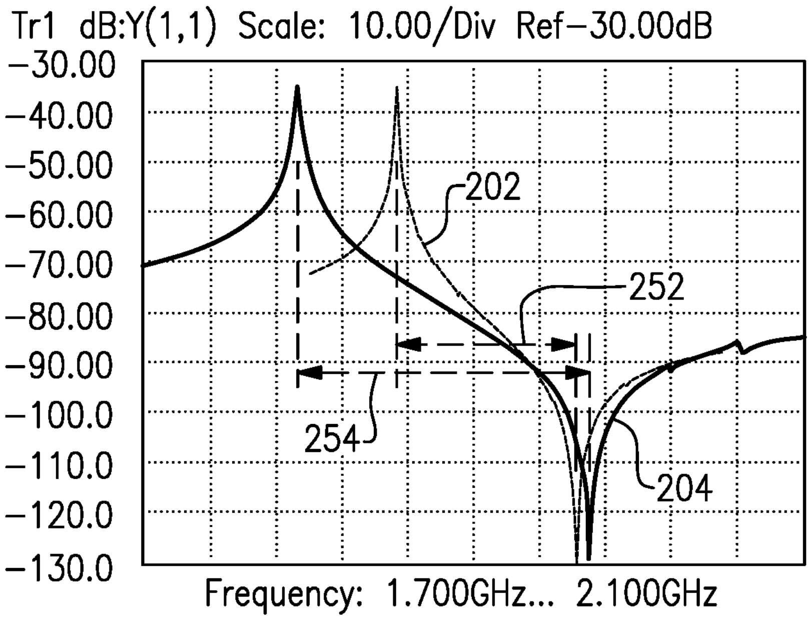
FIG. 9 shows a graph that compares the admittance of two acoustic wave devices.
Figure 10:
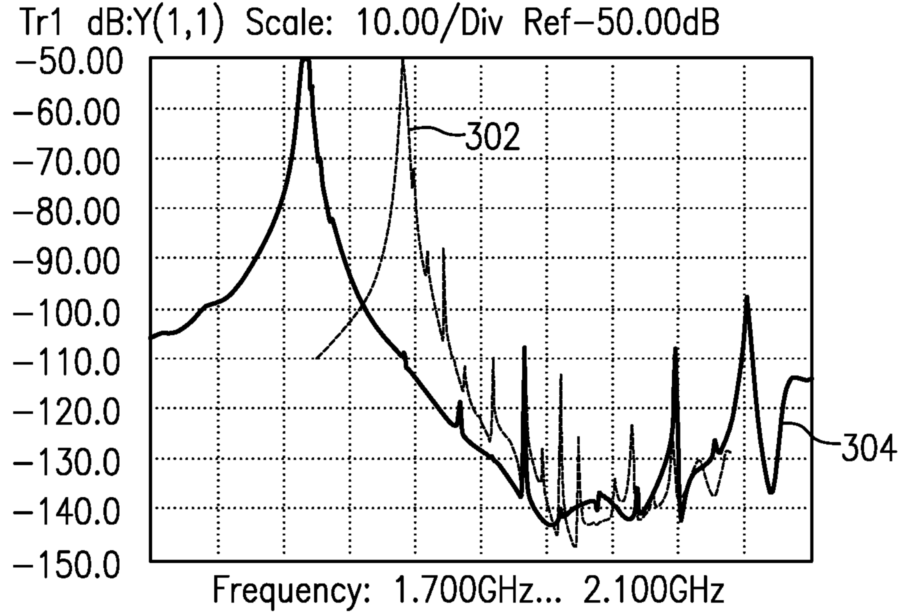
FIG. 10 shows a graph that compares the conductance of two acoustic wave devices.
Figure 11:
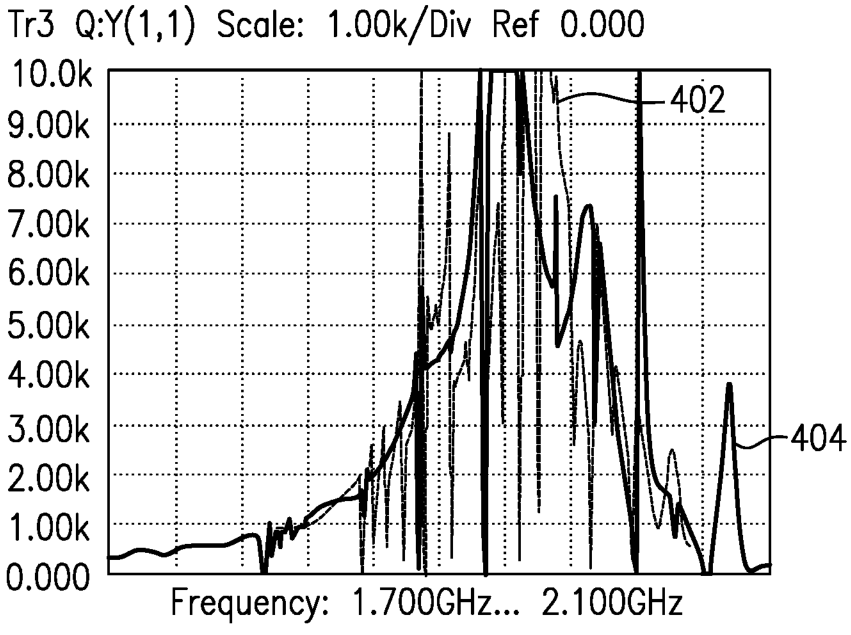
FIG. 11 shows a graph that compares Q values of two acoustic wave devices.

FIGS. 9, 10, and 11 are graphs that compare simulated performance results of a first acoustic wave device 100 that has a design similar to FIGS. 1A and 1B and a second acoustic wave device 100 that has a design similar to FIGS. 8A and 8B. The first acoustic wave device 100 has a silicon (Si) substrate as the substrate 102, a silicon dioxide layer ($SiO_2$) layer as the dielectric layer 104, a lithium tantalate (LT) layer as the piezo electric layer 106, and an aluminum (Al) layer as the IDT electrode 108, and a silicon nitride (SiN) layer as the passivation layer 128. The second acoustic wave device 100 has a silicon (Si) substrate an the substrate 102, a silicon dioxide ($SiO_2$) layer as the dielectric layer 104, a lithium niobate (LN) layer as the piezo electric layer 106, a multi-layer IDT electrode 108 with a molybdenum (Mo) layer as the first layer 160 and an aluminum (Al) layer as the second layer 162, a silicon dioxide layer ($SiO_2$) as the overcoat layer 125, raised frame structures 124, 126 made of silicon dioxide, and a silicon nitride (SiN) layer as the passivation layer 128. For the second acoustic wave device 100, the silicon substrate 102 can have a thickness 141 of at least about 5 times the distance L 142 (e.g., 5L), the silicon dioxide layer 104 can have a thickness 143 of about 0.2L, the LN piezoelectric layer 106 can have a thickness 145 of about 0.2L, the overcoat layer 125 can have a thickness 147 of about 0.2L, the active area 130 can have a width of about 20L, the raised frame structures 124, 126 can have widths 140 of about 0.75L, and the raised frame structures 124, 126 can be offset inward from the edges of the active area 130 by an offset distance 139 of about 0.2L. Various other dimensions and design combinations are possible, some of which are discussed herein.

FIG. 9 shows a graph that compares the admittance of the first acoustic wave device that is similar to FIGS. 1A and 1B, which is shown by line 202, and the admittance for the second acoustic wave device 100 that is similar to FIGS. 8A and 8B, which is shown by line 204. The electromechanical coupling coefficient ($k^2$) can be associated with the difference between the resonant frequency and anti-resonant frequency. FIG. 9 can indicate that the second acoustic wave device 100 similar to FIGS. 8A and 8B can have frequency difference 254 between the resonant and anti-resonant frequencies that is larger than the frequency difference 252 between the resonant and anti-resonant frequencies of the first acoustic wave device 100 that is similar to FIGS. 1A and 1B, which can indicate that the second acoustic wave device 100 has a larger electromechanical coupling coefficient ($k^2$) than the first acoustic wave device 100.

FIG. 10 shows a graph that compares the conductance (dB) of the first acoustic wave device that is similar to FIGS. 1A and 1B, which is shown by line 302, and the conductance (dB) for the second acoustic wave device 100 that is similar to FIGS. 8A and 8B, which is shown by line 304. In FIG. 10, the spurious noise (e.g., from transverse or other spurious modes) can be represented by spikes and dips that break from the general continuity of the plots. FIG. 10 can indicate that the second acoustic wave device 100 that is similar to FIGS. 8A and 8B can have reduced noise (e.g., improved suppression of the transverse mode), as compared to the first acoustic wave device 100 that is similar to the Figures of 1A and 1B.

FIG. 11 shows a graph that compares Q values of the first acoustic wave device that is similar to FIGS. 1A and 1B, which is shown by line 402, and the Q values for the second acoustic wave device 100 that is similar to FIGS. 8A and 8B, which is shown by line 404. FIG. 11 can indicate that the second acoustic wave device 100 that is similar to FIGS. 8A and 8B can have improved Q values (e.g., with fewer dips), as compared to the first acoustic wave device 100 that is similar to the Figures of 1A and 1B.

Figure 12:
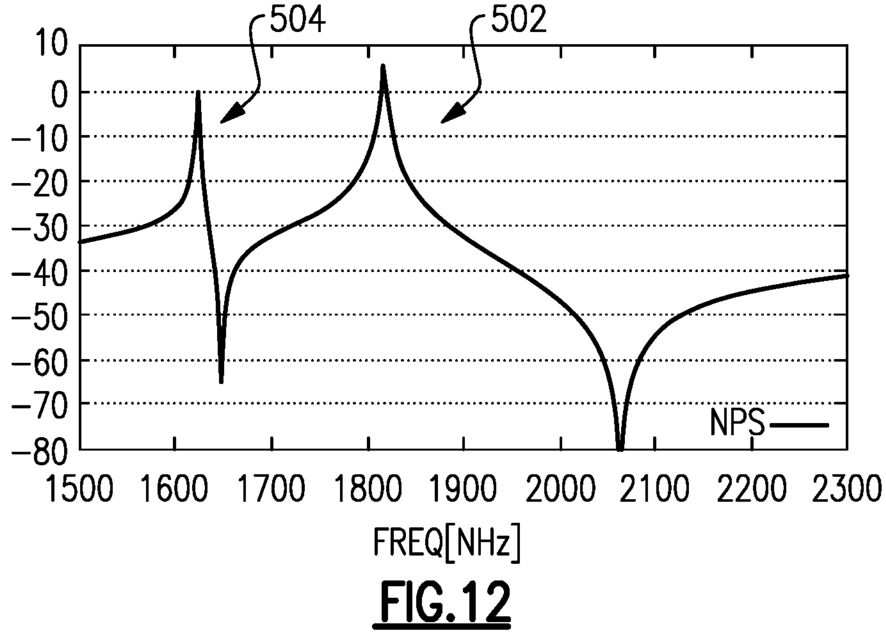
FIG. 12 shows an example plot of the admittance of an acoustic wave device.

FIG. 12 shows an example plot of the admittance of an acoustic wave device 100, which can be similar to the design of FIG. 6. The acoustic wave device 100 can have a main mode 502 and a Rayleigh mode 504. In some cases, it can be advantageous to reduce or minimize the electromechanical coupling coefficient ($k^2$) of the Rayleigh mode 504 and/or to increase or maximize the electromechanical coupling coefficient ($k^2$) of the main mode 502. The acoustic wave device 100 can include a piezoelectric layer 106 with a crystalline structure, and the cut angle or orientation of the crystalline structure of the piezoelectric layer 106 can affect the main mode and/or the Rayleigh mode of the device 100.

Figure 13:
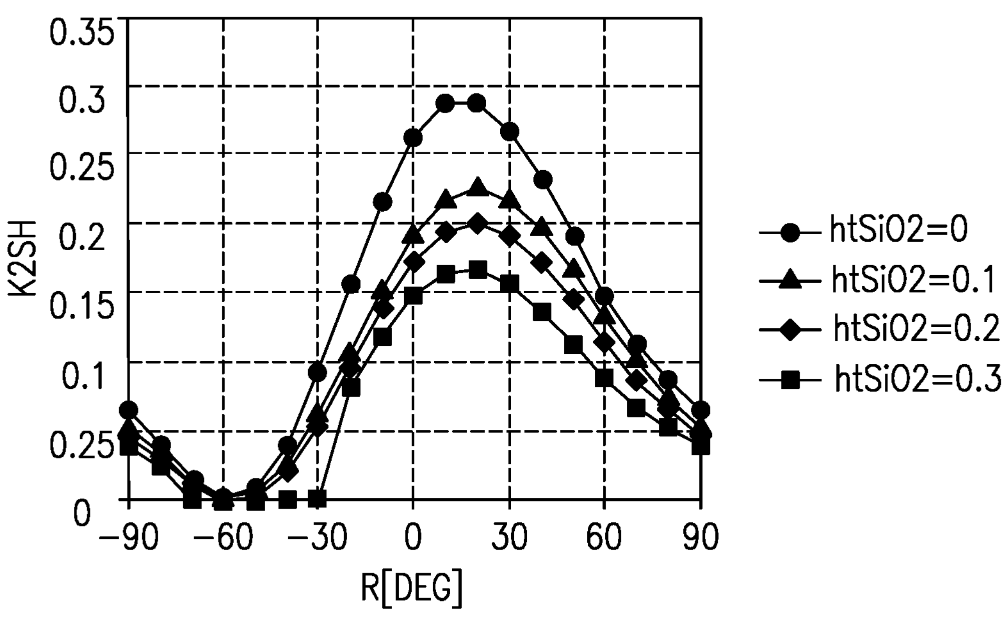
FIG. 13 shows a graph with plots of the effective electromechanical coupling coefficients ($k^2$) of the main mode of various example acoustic wave devices.
Figure 14:
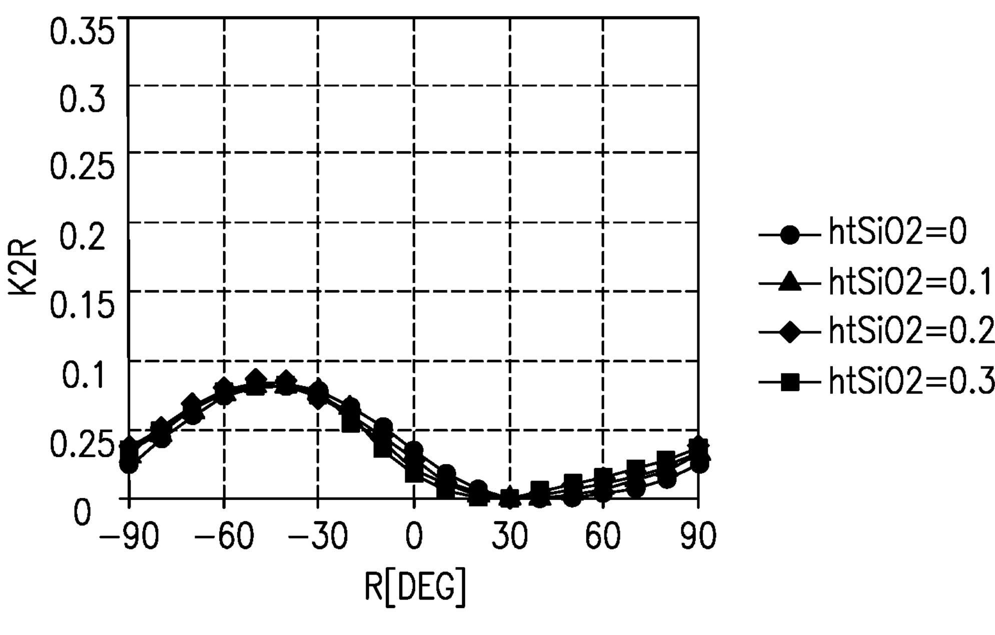
FIG. 14 shows a graph with plots of the effective electromechanical coupling coefficients ($k^2$) of the Rayleigh mode of various example acoustic wave devices.

FIG. 13 shows a graph with plots of the effective electromechanical coupling coefficients ($k^2$) of the main mode 502 (K2SH in the Y-axis) of various example acoustic wave devices 100 similar to the design of FIG. 6. FIG. 14 shows a graph with plots of the effective electromechanical coupling coefficients ($k^2$) of the Rayleigh mode 505 (K2R in the Y-axis) of various example acoustic wave devices 100 similar to the design of FIG. 6. In FIGS. 13 and 14, the acoustic wave devices 100 can have a silicon substrate 102, a silicon dioxide layer 104 with a thickness of about 0.3L, a lithium niobate (LN) piezoelectric layer 106 with a thickness 145 of about 0.3L, and an aluminum IDT electrode 108 with a thickness of about 0.8L. The different lines of FIGS. 13 and 14 represent different thicknesses 147 of the silicon dioxide overcoat layer 125 with values of 0 (omitted), 0.1L, 0.2L, and 0.3L. The orientation of the crystalline structure of the piezoelectric layer (e.g., LN) can be expressed as R degrees rotated Y-cut X-propagation lithium niobate ($LiNbO_3$), and the X-axis of FIGS. 13 and 14 corresponds to the R values at various angles between −90 degrees and +90 degrees. FIG. 13 can indicate that the effective electromechanical coupling coefficient ($k^2$) for the main mode (K2SH) can have maximum values at about +20 degrees for the R value, and minimum values at about −60 degrees for the R value. As can be seen in FIG. 14, the effective electromechanical coupling coefficient ($k^2$) for the Rayleigh mode (K2R) can have maximum values at about −50 degrees for the R value, and minimum values at about +30 degrees for the R value. In some embodiments, the acoustic wave device 100 can have a piezoelectric layer 106 that includes a material (e.g., lithium niobate) that can be R degrees rotated Y-cut X-propagation lithium niobate, where R can have a value that is about −15 degrees, about −10 degrees, about −5 degrees, about 0 degrees, about 5 degrees, about 10 degrees, about 15 degrees, about 20 degrees, about 25 degrees, about 30 degrees, about 35 degrees, about 40 degrees, about 45 degrees, about 50 degrees, about 55 degrees, about 60 degrees, or any values or ranges between any of these values (e.g., between about 0 degrees and about 60 degrees, between about 0 degrees and about 45 degrees, between about 10 degrees and 35 degrees, etc.).

Figure 15:
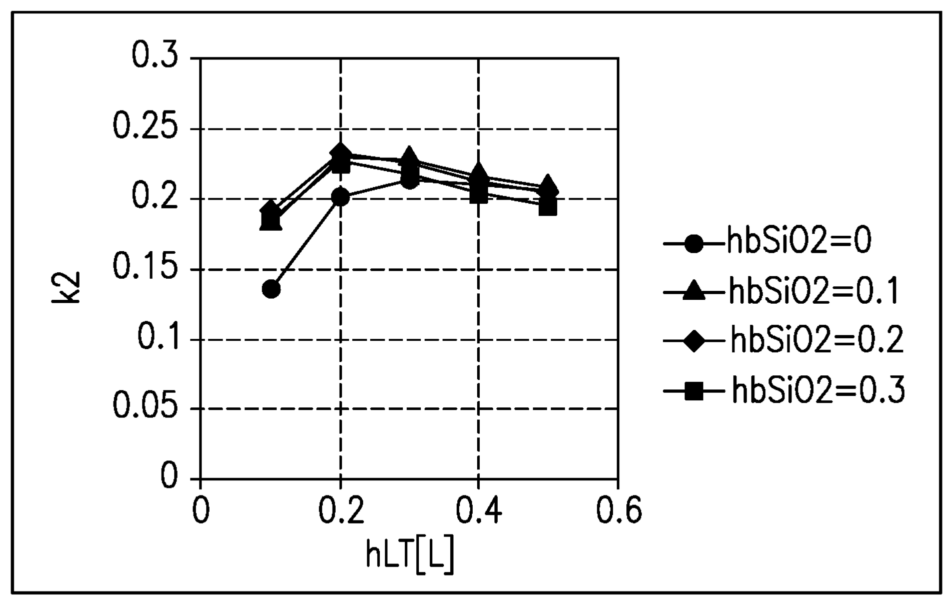
FIG. 15 shows a graph with plots of the effective electromechanical coupling coefficients ($k^2$) of various example acoustic wave devices.
Figure 16:
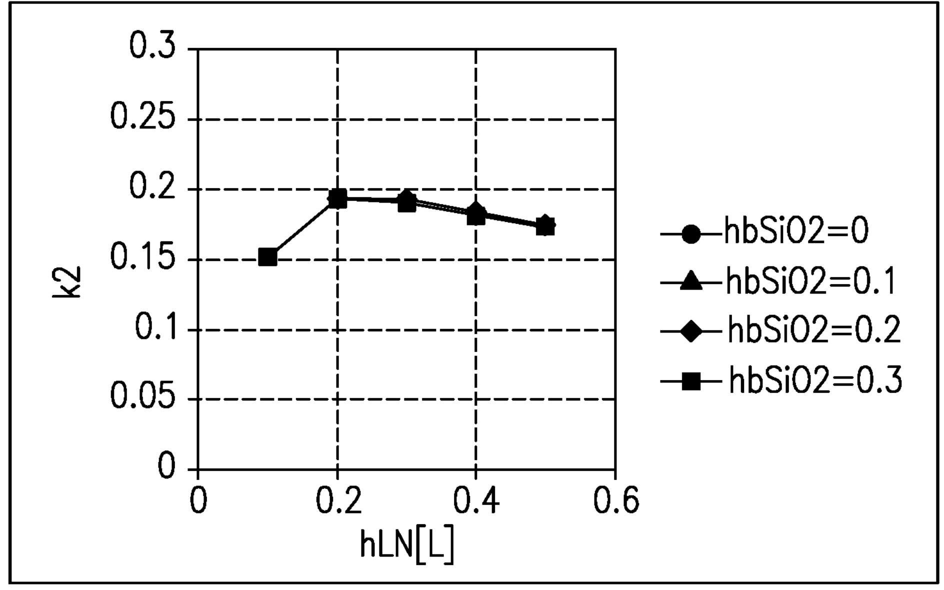
FIG. 16 shows a graph with plots of the effective electromechanical coupling coefficients ($k^2$) of various example acoustic wave devices.

FIG. 15 shows a graph with plots of the effective electromechanical coupling coefficients ($k^2$) of various example acoustic wave devices 100 that have a piezoelectric layer 106 made of lithium niobate ($LiNbO_3$ or LN) and a topcoat layer 125 with a thickness 147 of 0.1L. FIG. 16 shows a graph with plots of the effective electromechanical coupling coefficients ($k^2$) of various example acoustic wave devices 100 that have a piezoelectric layer 106 made of lithium niobate ($LiNbO_3$ or LN) and a topcoat layer 125 with a thickness 147 of 0.2L. In FIGS. 15 and 16, the X-axis represents the thickness of the LN piezoelectric layer, with values at 0.1L, 0.2L, 0.3L, 0.4L, and 0.5L. The different lines represent different thicknesses of the dielectric layer 104 (e.g., silicon dioxide), with values at 0 (omitted), 0.1L, 0.2L, and 0.3L. The Y-axis shows the effective electromechanical coupling coefficient ($k^2$) values. As can be seen by comparing FIG. 3 to FIG. 15, adding the topcoat layer 125 with thickness 147 of 0.1L can reduce the $K^2$ values of the acoustic wave device 100. FIG. 15 and FIG. 16 can indicate that increasing the thickness 147 of the topcoat layer 125 from 0.1L to 0.2L can further reduce the $K^2$ values of the acoustic wave device 100.

Figure 17:
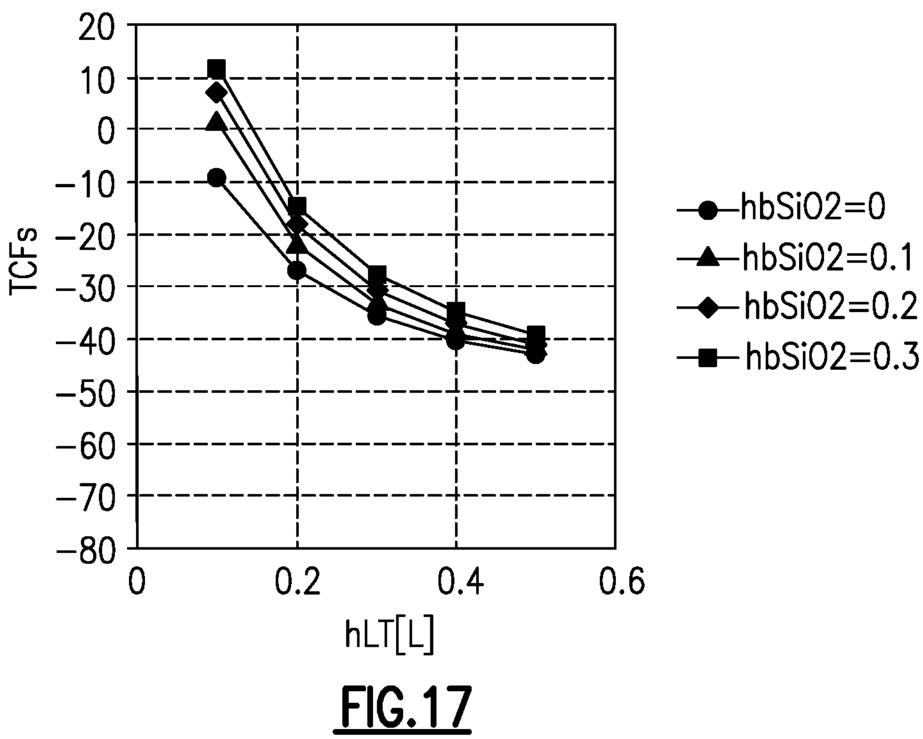
FIG. 17 shows a graph with plots of the temperature coefficients of frequency (TCF) of various example acoustic wave devices.
Figure 18:
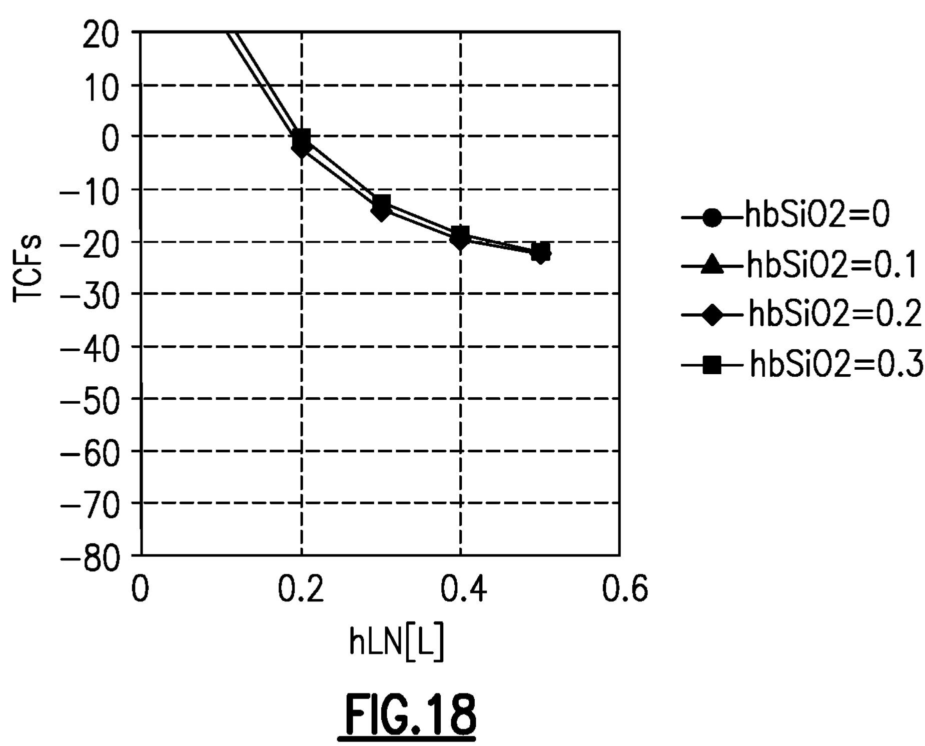
FIG. 18 shows a graph with plots of the temperature coefficients of frequency (TCF) of various example acoustic wave devices.

FIG. 17 shows a graph with plots of the temperature coefficients of frequency (TCF) of various example acoustic wave devices 100 that have a piezoelectric layer 106 made of lithium niobate ($LiNbO_3$ or LN) and a topcoat layer 125 with a thickness 147 of 0.1L. FIG. 18 shows a graph with plots of the temperature coefficients of frequency (TCF) of various example acoustic wave devices 100 that have a piezoelectric layer 106 made of lithium niobate ($LiNbO_3$ or LN) and a topcoat layer 125 with a thickness 147 of 0.2L. In FIGS. 17 and 18, the X-axis represents the thickness of the LN piezoelectric layer, with values at 0.1L, 0.2L, 0.3L, 0.4L, and 0.5L. The different lines represent different thicknesses of the dielectric layer 104 (e.g., silicon dioxide), with values at 0 (omitted), 0.1L, 0.2L, and 0.3L. The Y-axis shows the temperature coefficient of frequency (TCF) values. FIG. 15 and FIG. 17 can indicate that adding the topcoat layer 125 with thickness 147 of 0.1L can improve the TCF values of the acoustic wave device 100 (e.g., by raising the TCF values and/or moving the TCF values closer to 0). FIG. 17 and FIG. 18 can indicate that increasing the thickness 147 of the topcoat layer 125 from 0.1L to 0.2L can further improve the TCF values (e.g., by raising the TCF values and/or moving the TCF values closer to 0).

The topcoat layer 125 can provide acoustic wave devices 100 with a piezoelectric layer made of lithium niobate ($LiNbO_3$ or LN) that have temperature coefficient of frequency (TCF) values that are generally comparable to acoustic wave devices 100 that have a piezoelectric layer made of lithium tantalate ($LiTaO_3$ or LT) (e.g., see FIG. 4 (LT) and FIG. 8 (LN)), while the effective electromechanical coupling coefficient ($k^2$) values of the acoustic wave devices 100 with a piezoelectric layer made of lithium niobate ($LiNbO_3$ or LN) are greater than the acoustic wave devices 100 that have a piezoelectric layer made of lithium tantalate ($LiTaO_3$ or LT) (e.g., see FIG. 2 (LT) and FIG. 16 (LN)). Accordingly, using piezoelectric layer 106 of lithium niobate ($LiNbO_3$ or LN) and topcoat layer 125 (e.g., of silicon dioxide) can provide for improved effective electromechanical coupling coefficient ($k^2$) values without significant degradation of the temperature coefficient of frequency (TCF) values. The topcoat layer 125 can have a thickness of about 0.05L, about 0.06L, about 0.07L, about 0.08L, about 0.09L, about 0.1L, about 0.11L, about 0.12L, about 0.13L, about 0.14L, about 0.15L, about 0.16L, about 0.17L, about 0.18L, about 0.19L, about 0.2L, about 0.21L, about 0.22L, about 0.23L, about 0.24L, about 0.25L, about 0.26L, about 0.27L, about 0.28L, about 0.29L, about 0.3L, about 0.32L, about 0.35L, about 0.4L, or any values or ranges between any of these values (e.g., between about 0.1L and about 0.3L, between about 0.15L and about 0.25L, etc.). The thickness of the topcoat layer 125 can be in a range between, for example, 0.05L and 0.4L, 0.05L and 0.3L, 0.05L and 0.2L, 0.1L and 0.4L, 0.2L and 0.4L, or 0.2L and 0.3L.

With reference to FIGS. 8A and 8B, in some embodiments increasing the thickness of the first layer 160 of the IDT electrode 108 can reduce the velocity of the of the resonant acoustic wave of the device 100.

Figure 19:
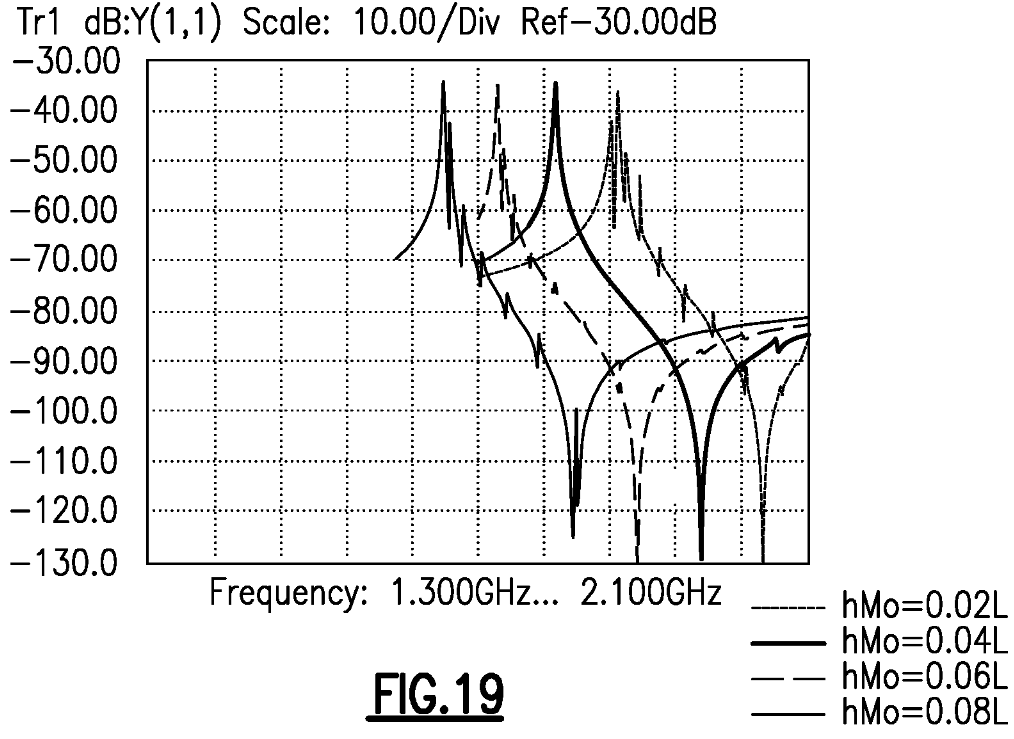
FIG. 19 is a graph that compares the admittance of acoustic wave devices.

FIG. 19 is a graph that compares simulated results of the admittance for acoustic wave devices 100 having different thicknesses for the first layer 160 of the IDT electrode 108. The acoustic wave devices 100 represented in FIG. 19 can have a design similar to FIGS. 8A and 8B, with a silicon substrate 102, a silicon dioxide layer 104, a lithium niobate piezoelectric layer 106, a molybdenum first layer 160 of the IDT electrode 108, an aluminum second layer 162 of the IDT electrode 108, a silicon dioxide topcoat layer 125, and silicon dioxide raised frame structures 124, 126. FIG. 19 shows admittance plots of acoustic wave devices with thickness values of the molybdenum first layer 160 of 0.02L, 0.04L, 0.06L, and 0.08L. FIG. 19 can indicate that as the thickness of the molybdenum first layer 160 increases, the resonant frequency (and the anti-resonant frequency) can shift to lower frequency values (e.g., as a result of the slower velocity of the resonant wave). The lower resonant frequency (e.g., an lower resonant wave velocity) that results from the thicker first layer 160 can enable the acoustic wave device 100 to be made smaller, such as by allowing the fingers 114, 116 of the IDT electrode 108 to be made closer together and/or with smaller widths, or by enabling the IDT electrode 108 to include fewer fingers. In some cases, as the wave velocity is reduced, the resonant wavelength is reduced (e.g., along with the resonant frequency), so that the distance 142 L can be made smaller, resulting in a reduced length for the acoustic wave device 100. In some cases. By way of example, increasing the molybdenum first layer 160 from 0.04L to 0.08L can produce an 8% slower wave velocity, which can enable an 8% reduction in the size (e.g., footprint) of the acoustic wave device 100.

Figure 20:
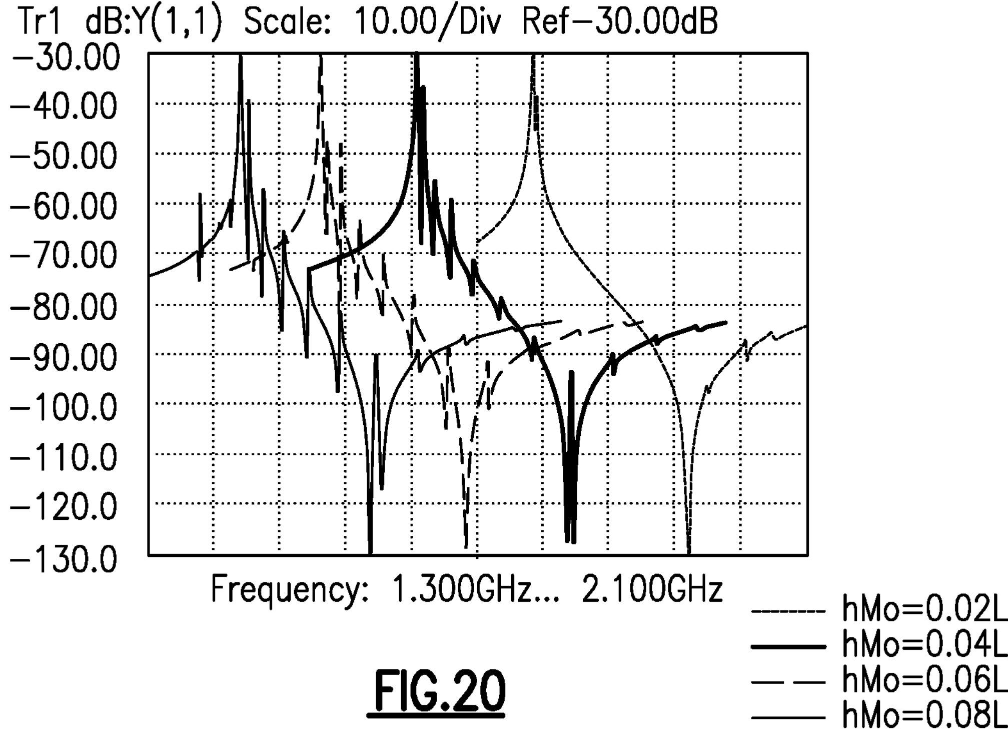
FIG. 20 is a graph that compares the admittance of acoustic wave devices.

FIG. 20 is a graph that compares simulated results of the admittance for acoustic wave devices 100 that are similar to those represented in FIG. 19, except that for FIG. 20 the first layer 160 of the IDT electrode 108 is made of tungsten (W) instead of molybdenum (Mo). FIG. 20 shows admittance plots for acoustic wave devices 100 with thickness values of 0.02L, 0.04L, 0.06L, and 0.08L for the tungsten first layer 160 of the IDT electrode 108. Increasing the thickness of the tungsten first layer 160 can shift the resonant frequency (and the anti-resonant frequency) to lower frequency values by a greater degree than for the molybdenum first layer 160 examples in FIG. 19, which can enable greater reduction in size for the acoustic wave devices 100. For example, increasing the tungsten first layer 160 from 0.04L to 0.08L can produce about 22% slower wave velocity, which can enable about 22% reducing in the size (e.g., footprint) of the acoustic wave device 100.

Increasing the thickness of the first layer 160 of the IDT electrode 108 can reduce the overall Q values of the acoustic wave devices. Accordingly, the reduction in size provided by increasing the thickness of the first layer 160 can be balanced against the goal of achieving high Q values. The first layer 160 of the IDT electrode 108 can have a thickness or height of about 0.01L, about 0.015L, about 0.02L, about 0.025L, about 0.03L, about 0.035L, about 0.04L, about 0.045L, about 0.05L, about 0.055L, about 0.6L, about 0.065L, about 0.07L, about 0.075L, about 0.08L, about 0.085L, about 0.09L, about 0.095L, about 0.1L, or more, or any values or ranges between any of these values (e.g., between about 0.01L and about 0.05L). The second layer 162 of the IDT electrode 108 can have a thickness or height of about 0.02L, about 0.025L, about 0.03L, about 0.035L, about 0.04L, about 0.045L, about 0.05L, about 0.055L, about 0.6L, about 0.065L, about 0.07L, about 0.075L, about 0.08L, about 0.085L, about 0.09L, about 0.095L, about 0.1L, about 0.11L, about 0.12L, or more, or any values or ranges between any of these values (e.g., between about 0.02L and about 0.08L).

Increasing the thickness of the first layer 160 of the IDT electrode 108 can also shift the leakage region to higher frequencies, and decreasing the thickness of the first layer 160 of the IDT electrode 108 can shift the leakage region to lower frequencies. Accordingly, the thickness of the first layer 160 of the IDT electrode 108 can be selected to provide a desired frequency or range, which can vary depending on the design or use of the acoustic wave device 100.

Figure 21:
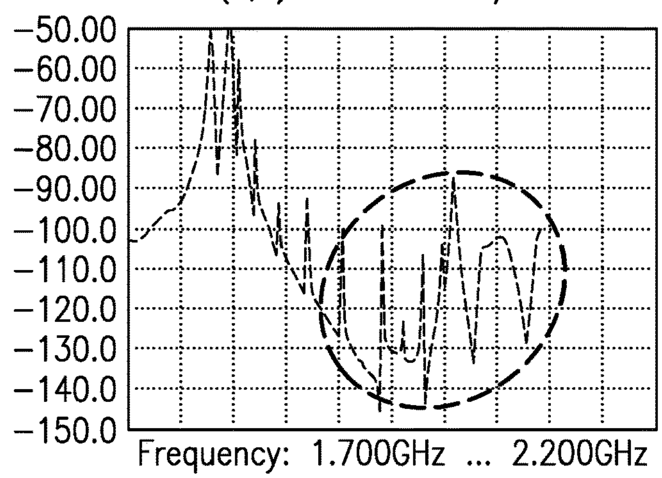
FIG. 21 shows a graphs of the conductance of an example acoustic wave device.
Figure 22:
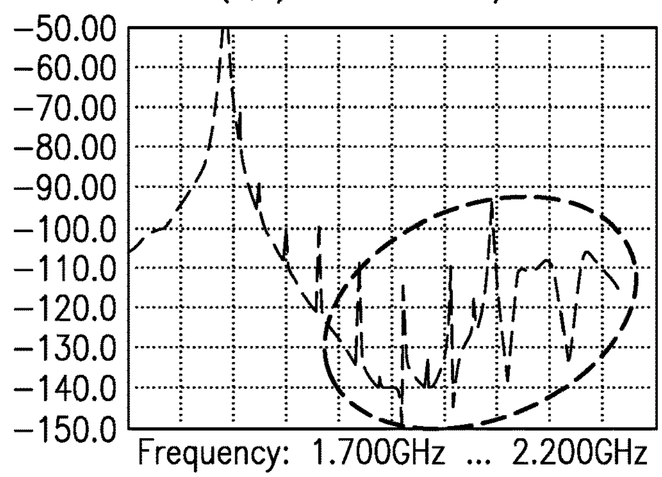
FIG. 22 shows a graphs of the conductance of another example acoustic wave device.
Figure 23:
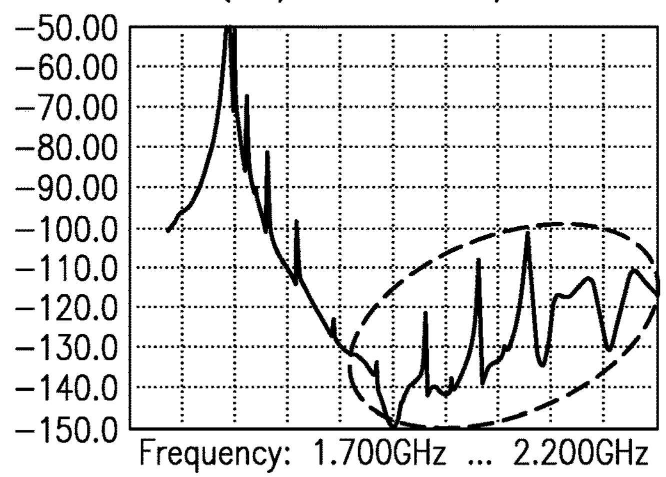
FIG. 23 shows a graphs of the conductance of another example acoustic wave device.

FIGS. 21, 22, and 23 show graphs of the conductance values (dB) of acoustic wave devices similar to those represented in FIG. 19 except that the thickness or height of the molybdenum first layer 160 is 0.01L in FIG. 21, 0.03L in FIG. 22, and 0.05L in FIG. 23. The leakage regions are circled with a dashed line in FIGS. 21, 22, and 23.

FIGS. 24 to 38 relate to acoustic wave devices 100 that have a design similar to FIGS. 8A and 8B, where the acoustic wave devices 100 can have a silicon substrate 102, a silicon dioxide layer 104 with a thickness of about 0.2L, a lithium niobate (LN) piezoelectric layer 106 with a thickness 145 of about 0.2L, and an aluminum IDT electrode 108 with a molybdenum first layer 160 with a thickness of 0.04L and an aluminum second layer 162 with a thickness of 0.04L, a silicon dioxide topcoat layer 125 with a thickness of 0.2L, and silicon dioxide raised frame structures 124, 126 with various dimensions, as discussed below.

Figure 24:
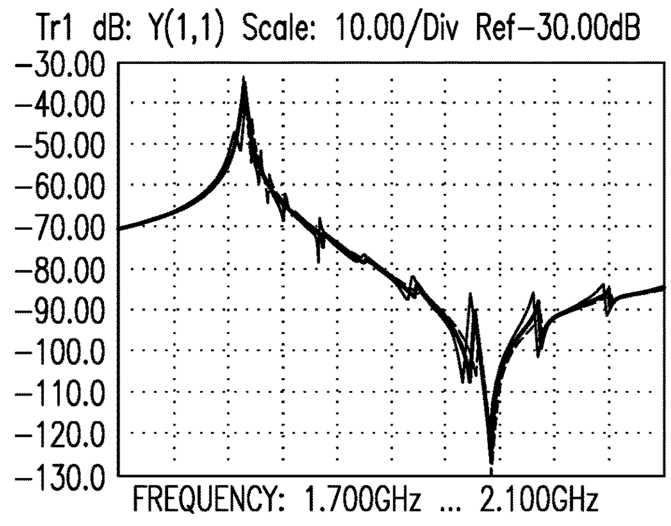
FIG. 24 is a graph that compares the admittance of example acoustic wave devices.
Figure 25:
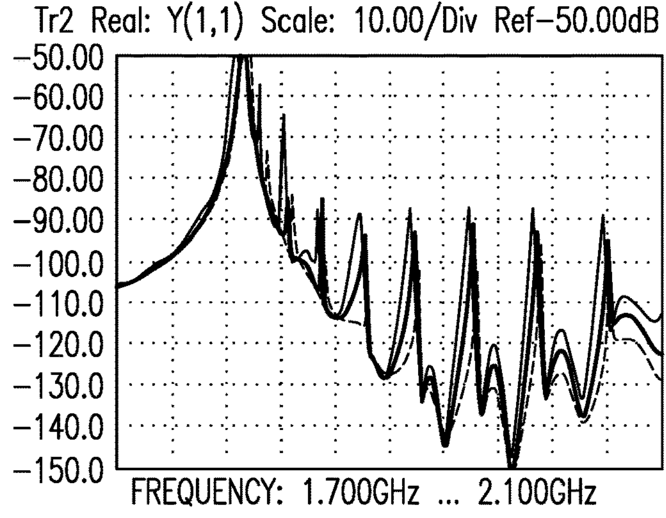
FIG. 25 is a graph that compares the conductance of example acoustic wave devices.
Figure 26:
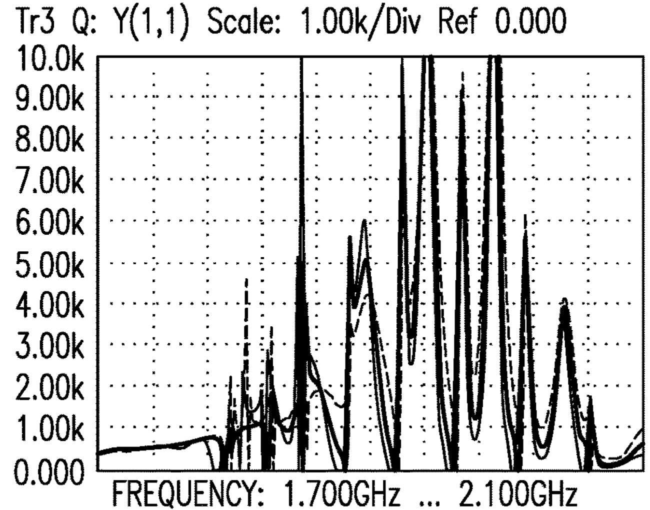
FIG. 26 is a graph that compares the Q values of example acoustic wave devices.
Figure 27:
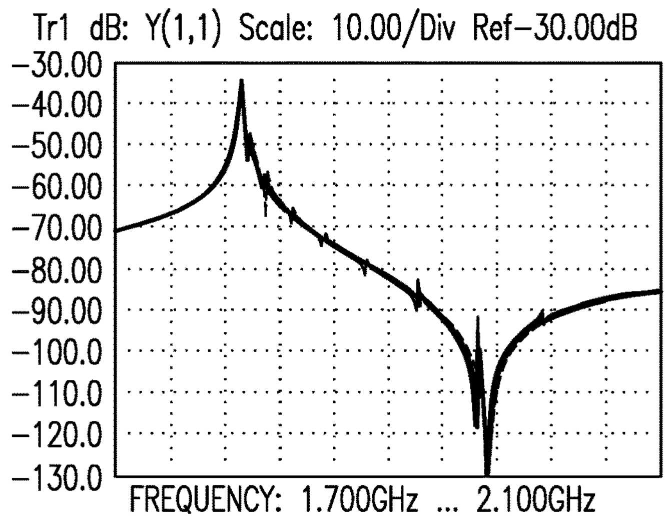
FIG. 27 is a graph that compares the admittance of example acoustic wave devices.
Figure 28:
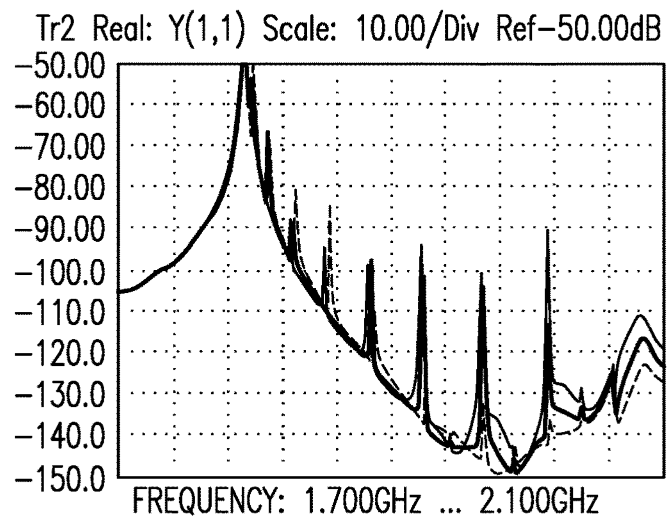
FIG. 28 is a graph that compares the conductance of example acoustic wave devices.
Figure 29:
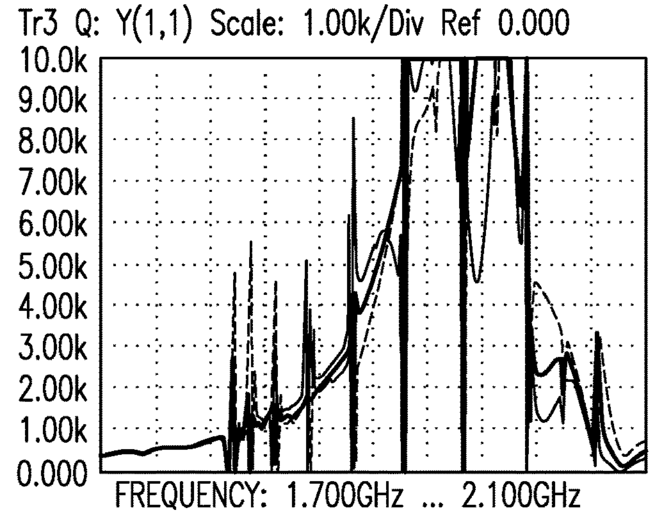
FIG. 29 is a graph that compares the Q values of example acoustic wave devices.
Figure 30:
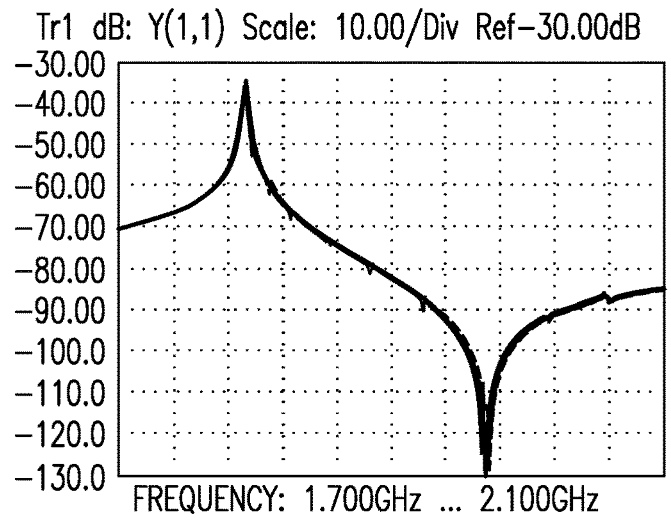
FIG. 30 is a graph that compares the admittance of example acoustic wave devices.
Figure 31:
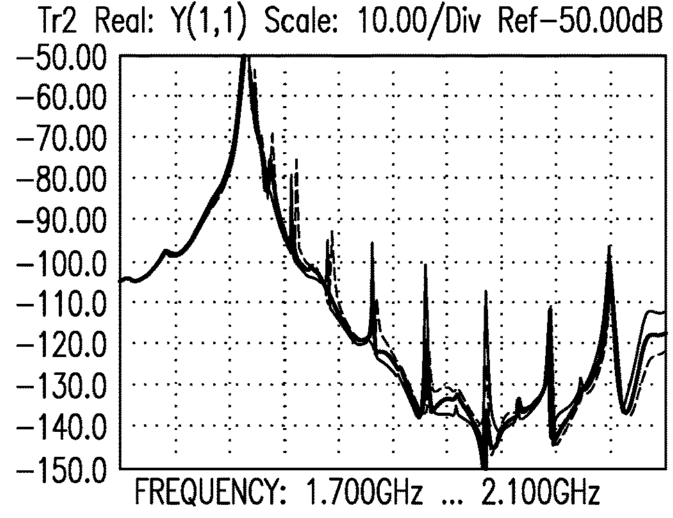
FIG. 31 is a graph that compares the conductance of example acoustic wave devices.
Figure 32:
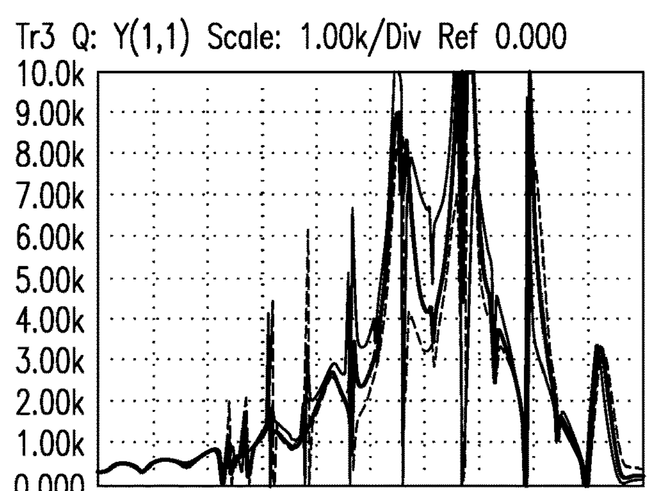
FIG. 32 is a graph that compares the Q values of example acoustic wave devices.

FIGS. 24, 25, and 26 are graphs that compare the admittance, conductance, and Q values (respectively) of acoustic wave devices 100 that have raised frame structures 124, 126 with a width 140 of 0.5L, and heights 138 of 0.12L, 0.14L, and 0.16L. FIGS. 27, 28, and 29 are graphs that compare the admittance, conductance, and Q values (respectively) of acoustic wave devices 100 that have raised frame structures 124, 126 with a width 140 of 0.75L, and heights 138 of 0.10L, 0.12L, and 0.14L. FIGS. 30, 31 and 32 are graphs that compare the admittance, conductance, and Q values (respectively) of acoustic wave devices 100 that have raised frame structures 124, 126 with a width 140 of 1L, and a heights 138 of 0.10L, 0.12L, and 0.14L. FIGS. 26 to 29 can indicate that increasing the width of the raised frame structures 124, 126 from 0.5L to 0.75L can make a significant improvement in the Q values. FIG. 29 and FIG. 32 can indicate that increasing the width of the raised frame structures 124, 126 further from 0.75L to 1L can reduce the Q values. FIGS. 24-25 and FIGS. 27-28 can indicate that increasing the width of the raised frame structures 124, 126 from 0.5L to 0.75L can improve the transverse mode suppression. FIGS. 27-28 and FIGS. 30-31 can indicate that increasing the width of the raised frame structures 124, 126 further from 0.75L to 1L can further improve the transverse mode suppression. Although not shown, when the width of the raised frame structures 124, 126 was increased further from 1L to 1.25L, the Q values were further reduced, and the transverse mode suppression was reduced.

The height or thickness 138 of the raised frame structure(s) 124, 126 (e.g., made of silicon dioxide) can have a value of about 0.05L, about 0.06L, about 0.07L, about 0.08L, about 0.09L, about 0.1L, about 0.11L, about 0.12L, about 0.13L, about 0.14L, about 0.15L, about 0.16L, about 0.17L, about 0.18L, about 0.19L, about 0.2L, about 0.21L, about 0.22L, about 0.23L, about 0.24L, about 0.25L, or more, or any values or ranges between any of these values (e.g., between about 0.08L and about 0.16L, between about 0.08L and about 0.16L, etc.). The thickness 138 of the raised frame structure(s) 124, 126 can be in a range between, for example, 0.05L and 0.25L, 0.05L and 0.2L, 0.05L and 0.1L, 0.1L and 0.25L, 0.15L and 0.25L, or 0.2L and 0.25L.

The width 140 of the raised frame structure(s) 124, 126 can have a value of about 0.25L, about 0.3L, about 0.35L, about 0.4L, about 0.45L, about 0.5L, about 0.55L, about 0.6L, about 0.65L, about 0.7L, about 0.75L, about 0.8L, about 0.85L, about 0.9L, about 0.95L, about 1L, about 1.05L, about 1.1L, about 1.15L, about 1.2L, about 1.25L, about 1.3L, about 1.35L, about 1.4L, about 1.45L, about 1.5L, about 1.6L, about 1.7L, about 1.8L, about 1.9L, about 2L, or more, or any values or ranges between any of these values (e.g., between about 0.5L and about 1.5L, between about 0.7L and about 1L, etc.). The width 140 of the raised frame structure(s) 124, 126 can be in a range between, for example, 0.25L and 2L, 0.35L and 2L, 0.5L and 2L, 1L and 2L, 0.25L and 1.5L, 0.25L and 1L, or 0.5L and 0.15L.

Figure 33:
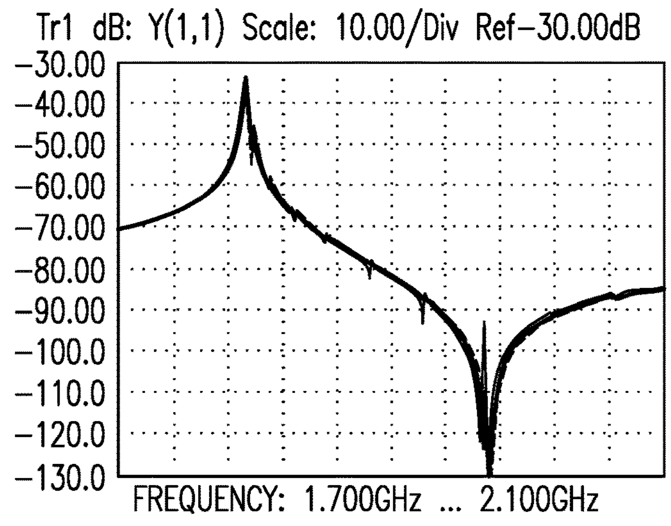
FIG. 33 is a graph that compares the admittance of example acoustic wave devices.
Figure 34:
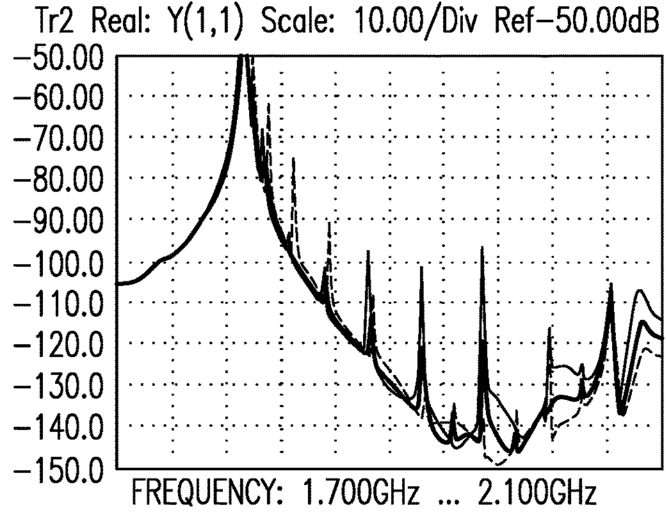
FIG. 34 is a graph that compares the conductance of example acoustic wave devices.
Figure 35:
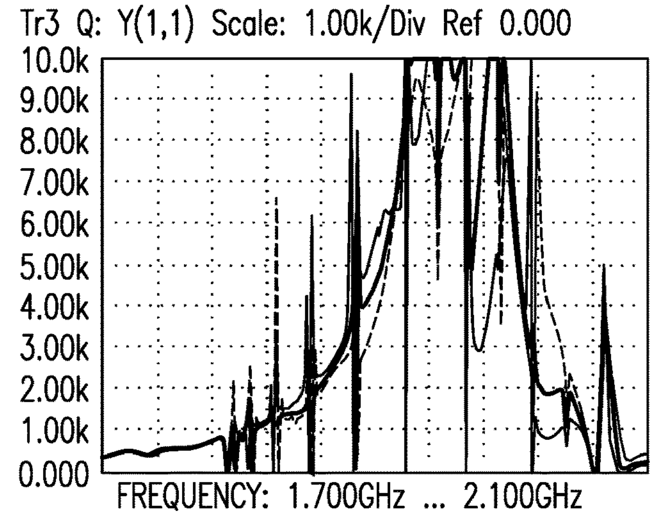
FIG. 35 is a graph that compares the Q values of example acoustic wave devices.
Figure 36:
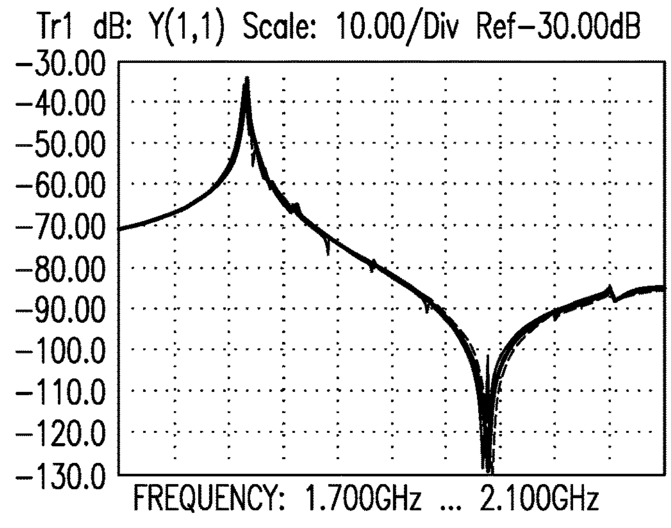
FIG. 36 is a graph that compares the admittance of example acoustic wave devices.
Figure 37:
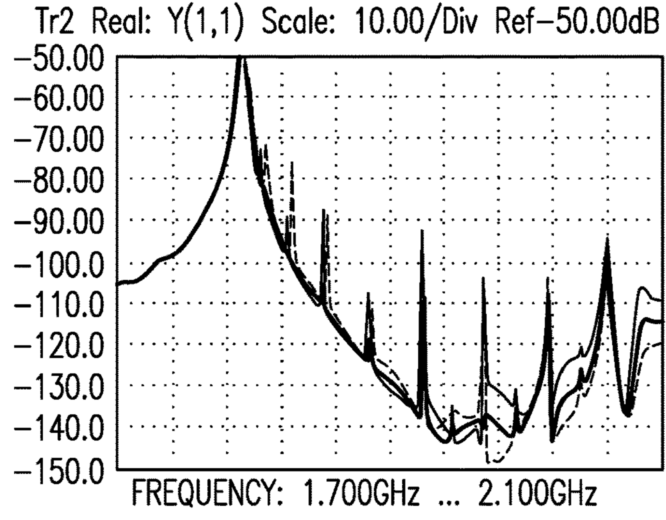
FIG. 37 is a graph that compares the conductance of example acoustic wave devices.
Figure 38:
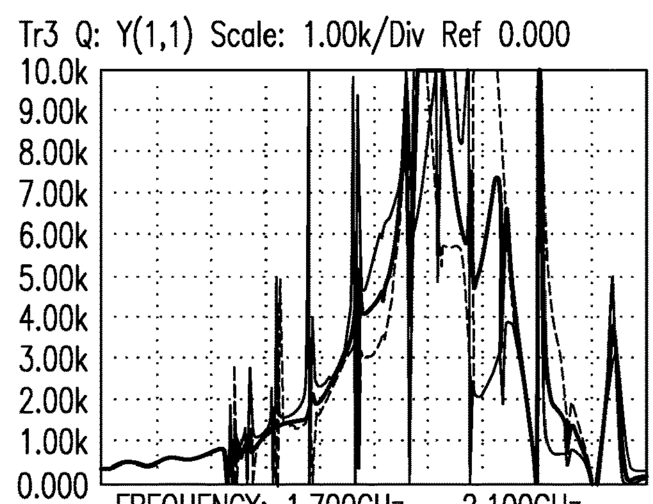
FIG. 38 is a graph that compares the Q values of example acoustic wave devices.

In FIGS. 24 to 32, the raised frame structures 124, 126 are positioned at the ends of the active area 130, and the offset distance 139 can be substantially zero. FIGS. 33, 34, and 35 are graphs that compare the admittance, conductance, and Q values (respectively) for acoustic wave devices 100 that have raised frame structures 124, 126 with a width 140 of 0.75L, an offset distance 139 of 0.1L, and heights 138 of 0.10L, 0.11L, and 0.12L. FIGS. 36, 37, and 38 are graphs that compare the admittance, conductance, and Q values (respectively) of acoustic wave devices 100 that have raised frame structures 124, 126 with a width 140 of 0.75L, an offset distance 139 of 0.2L, and heights 138 of 0.10L, 0.11L, and 0.12L. FIGS. 27-29 and FIGS. 33-35 can indicate that offsetting the raised frame structures 124, 126 inward by 0.1L can produce improved transverse mode suppression with comparable, or only minor degradation in, Q values. FIGS. 27 to 29 and 36 to 38 can indicate that an offset distance 139 of about 0.2L can also improve the transverse mode suppression, with only minor degradation in the Q values. The offset distance 139 can be about 0, with the outer end of the raised frame structure(s) 124, 126 at the end of the active area 130, or the inward offset distance 139 can be about 0.01L, about 0.02L, about 0.03L, about 0.04L, about 0.05L, about 0.06L, about 0.07L, about 0.08L, about 0.09L, about 0.1L, about 0.11L, about 0.12L, about 0.13L, about 0.14L, about 0.15L, about 0.16L, about 0.17L, about 0.18L, about 0.19L, about 0.2L, about 0.21L, about 0.22L, about 0.23L, about 0.24L, about 0.25L, about 0.26L, about 0.27L, about 0.28L, about 0.29L, about 0.3L, or more, or any values or ranges between any of these values (e.g., between about 0.05L and about 0.25L, between about 0.1L and about 0.2L, etc.). In some embodiments, the distance 139 can be in a range between, for example, 0.01L and 0.3L, 0.05L and 0.3L, 0.1L and 0.3L, 0.01L and 0.2L, or 0.01L and 0.1L. In some embodiments, the raise frame structure(s) 124, 126 can be offset outward, so that the outer end of the raised frame structure(s) 124, 126 extending outward past the end of the active area 130 by an outward offset distance that can be about 0.01L, about 0.02L, about 0.03L, about 0.04L, about 0.05L, about 0.06L, about 0.07L, about 0.08L, about 0.09L, about 0.1L, about 0.11L, about 0.12L, about 0.13L, about 0.14L, about 0.15L, about 0.16L, about 0.17L, about 0.18L, about 0.19L, about 0.2L, about 0.21L, about 0.22L, about 0.23L, about 0.24L, about 0.25L, about 0.26L, about 0.27L, about 0.28L, about 0.29L, about 0.3L, or more, or any values or ranges between any of these values (e.g., between about 0.05L and about 0.25L, between about 0.1L and about 0.2L, etc.). In some embodiments, the distance 139 can be in a range between, for example, 0.01L and 0.3L, 0.05L and 0.3L, 0.1L and 0.3L, 0.01L and 0.2L, or 0.01L and 0.1L.

In some embodiments, the first and second raised frame structures 124, 126 can be positioned in an edge region of the acoustic wave devices 100. The edge region can be a region within 0.45L from an edge of the active region 130 (e.g., a region where the surface acoustic wave is generated or manipulated) in a direction transverse to a wave propagation direction. For example, the first and second raised frame structures 124, 126 can be positioned in the edge region but spaced from the edge of the active region 130 by the distance 139.

Many variations are possible. The height 138 and/or the width 140 of the raised frame structures 124, 126 can be the same for the first raised frame structure 124 and the second raised frame structure 126, although they could be different in some implementations. In some embodiments, the materials and/or thicknesses of the first layer 160 and the second layer 162 can be switched or altered (e.g., with the first layer 160 being aluminum and the second layer 162 being molybdenum, etc.). The thickness of the raised frame structures 124, 126 can relate to the mass density of the material of the raised frame structures 124, 126. The raised frame structure(s) 124, 126 can be made of aluminum (Al) in some embodiments, which can enable the raised frame structure to be made thinner than the embodiments with silicon dioxide raised frame structures. For example, aluminum raised frame structures 124, 126 with a height or thickness 138 of about 0.065L produced suppression of the transverse mode similar to silicon dioxide raised frame structures 124, 126 with a height or thickness 138 of 0.12L. In some embodiments, the raised frame structure(s) 124, 126 can be made of molybdenum (Mo), which can enable the raised frame structure to be made even thinner. Molybdenum raised frame structures 124, 126 with a height or thickness 138 of about 0.025L produced suppression of the transverse mode similar to silicon dioxide raised frame structures 124, 126 with a height or thickness 138 of 0.12L. Accordingly, the values and ranges listed herein for the height or thickness 138 of the raised frame structure(s) 124, 126 can be divided by about 2 for aluminum raised frame structure(s) 124, 126, or divided by about 5 for molybdenum raised frame structure(s) 124, 126. Tungsten or other materials could be used to enable raised frame structure(s) 124, 126 that are thinner still.

Figure 39:
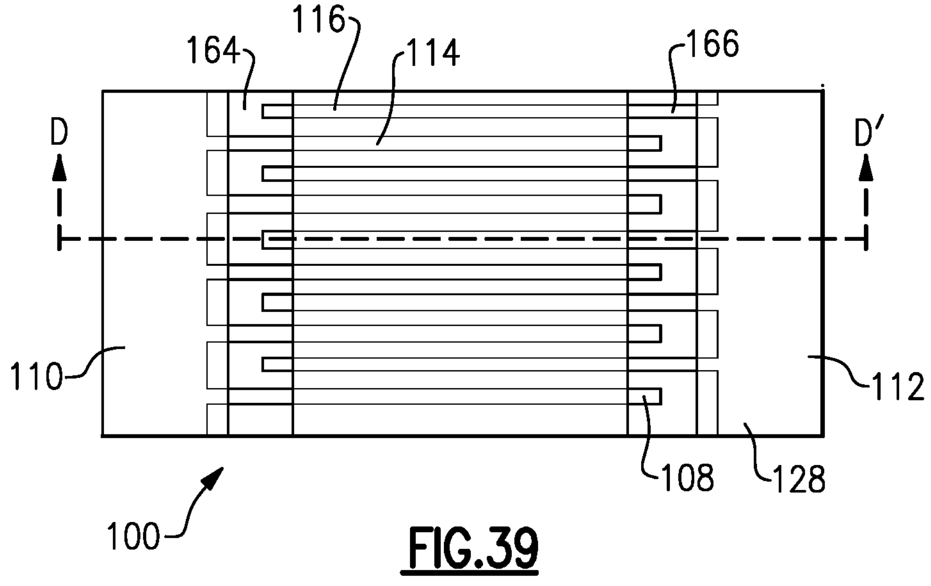
FIG. 39 is a schematic plan view of an example of an acoustic wave device.
Figure 40:
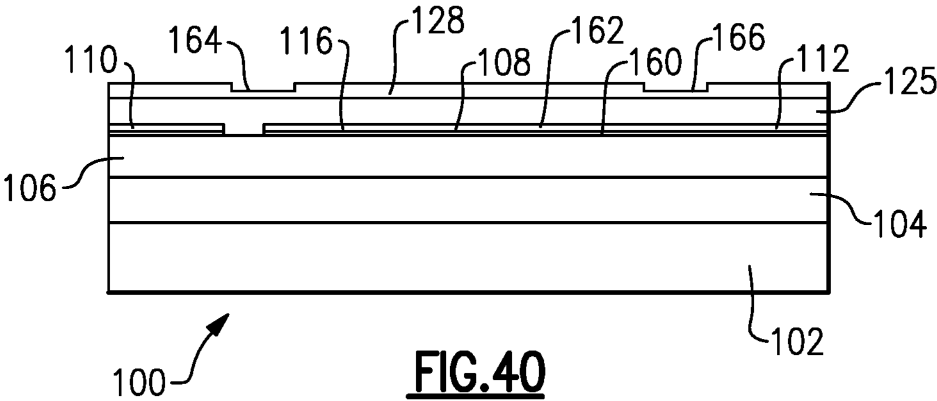
FIG. 40 is a schematic cross-sectional view of an example of an acoustic wave device.

Other structures can be used to facilitate suppression of the transverse mode(s), such as instead of or in addition to the raised frame structure(s) 124, 126. FIG. 39 shows a schematic plan view of an example acoustic wave device 100, which can be similar to the other acoustic wave devices 100 disclosed herein, except as described. FIG. 40 shows a schematic cross-sectional view of the example acoustic wave device 100 taken through the line from D to D' in FIG. 39. The passivation layer 128 can include one or more trenches 164, 166, where the passivation layer 128 has a smaller height or thickness. The trench(es) 164, 166 can extend generally orthogonal to the fingers 114, 116. A first trench 164 can extend along the ends of the second fingers 116. A second trench 166 can extend along the ends of the first fingers 114. The trenches 164, 166 can overlap the ends of the active area 130 (as shown in FIGS. 39 and 40), can have ends that substantially align with corresponding ends of the active area 130, and/or can be offset inward from the ends of the active area 130 (e.g., similar to the inward offset of the raised frame structures).

Figure 41:
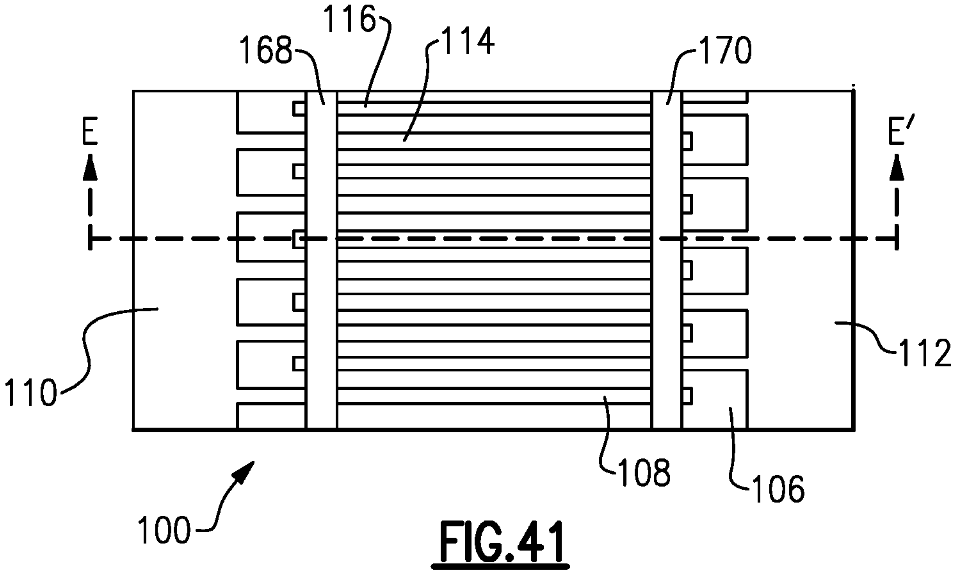
FIG. 41 is a schematic plan view of an example of an acoustic wave device.
Figure 42:
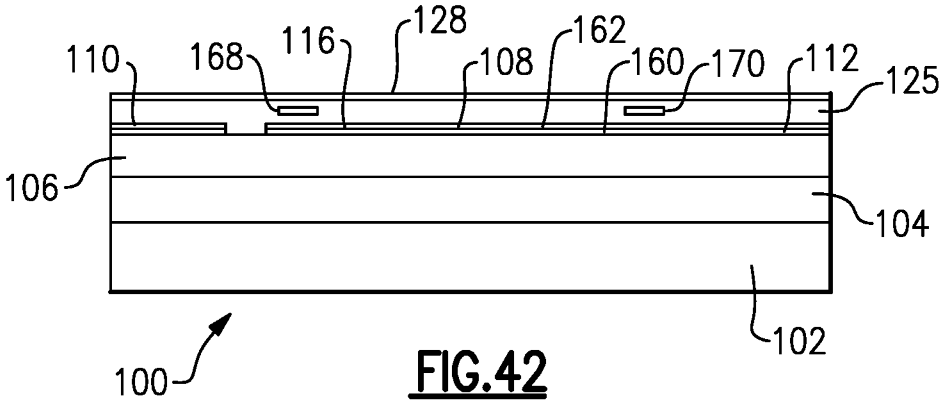
FIG. 42 is a schematic cross-sectional view of an example of an acoustic wave device.

FIG. 41 shows a schematic plan view of an example acoustic wave device 100, which can be similar to the other acoustic wave devices 100 disclosed herein, except as described. FIG. 42 shows a schematic cross-sectional view of the example acoustic wave device 100 taken through the line from E to E' in FIG. 41. The acoustic wave device 100 can have one or more embedded strips 168, 170 which can be buried or embedded in the overcoat layer 125. The strip(s) 168, 170 can be made of a metal or conductive material. The strip(s) 168, 170 can be made of a material with a higher acoustic impedance than the material of the overcoat layer 125, which can be silicon dioxide. The strip(s) 168, 170 can be made of aluminum, molybdenum, tungsten, or various other materials disclosed herein. The overcoat layer material can be disposed between the strip(s) 168, 170 and the IDT electrode 108 (e.g., under the strip(s)), and also between the strip(s) 168, 170 and the passivation layer 128 (e.g., over the strip(s)). The strip(s) 168, 170 can extend generally orthogonal to the fingers 114, 116. A first strip 168 can extend along the ends of the second fingers 116. A second strip 170 can extend along the ends of the first fingers 114. The strip(s) 168, 170 can overlap the ends of the active area 130, can have ends that substantially align with corresponding ends of the active area 130, and/or can be offset inward from the ends of the active area 130 (e.g., similar to the inward offset of the raised frame structures). The acoustic wave device 100 can also include the raised frame structure(s) 124, 126, or in some cases the raised frame structure(s) 124, 126 can be omitted.

Figure 43:
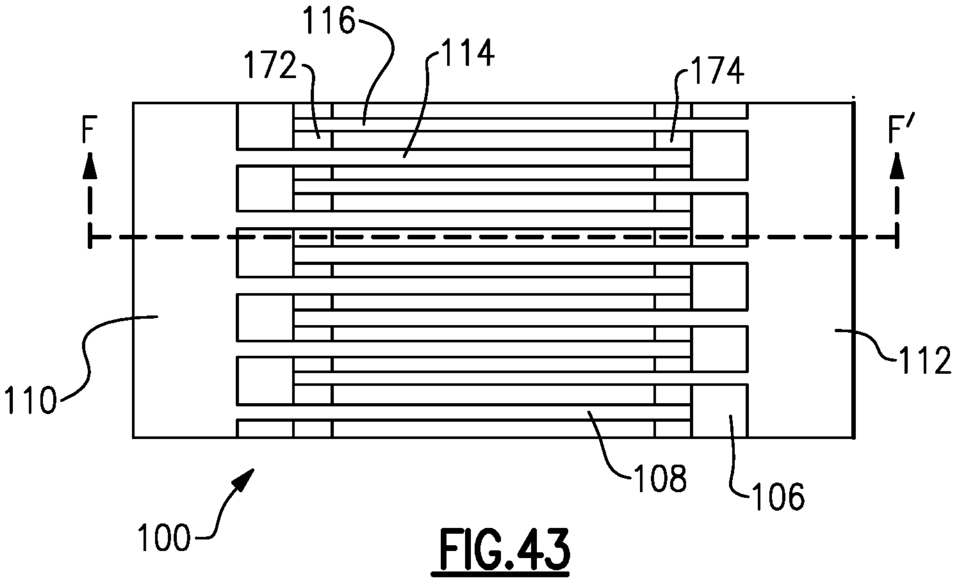
FIG. 43 is a schematic plan view of an example of an acoustic wave device.
Figure 44:
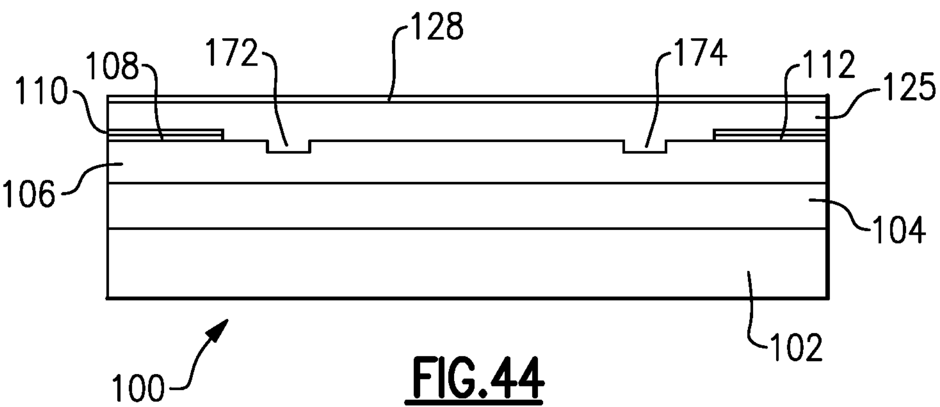
FIG. 44 is a schematic cross-sectional view of an example of an acoustic wave device.

FIG. 43 shows a schematic plan view of an example acoustic wave device 100, which can be similar to the other acoustic wave devices 100 disclosed herein, except as described. FIG. 44 shows a schematic cross-sectional view of the example acoustic wave device 100 taken through the line from F to F' in FIG. 43. The acoustic wave device 100 can have one or more trenches 172, 174 formed in the piezoelectric layer 106 (e.g., on the top side thereof or on the side facing towards the IDT electrode 108). The trench(es) 172, 174 can be filled with the same material as the overcoat layer 125 (e.g., silicon dioxide). The trench(es) 172, 174 can extend generally orthogonal to the fingers 114, 116. A first trench 172 can extend along the ends of the second fingers 116. A second trench 174 can extend along the ends of the first fingers 114. The trench(es) 172, 174 can overlap the ends of the active area 130, can have ends that substantially align with corresponding ends of the active area 130, and/or can be offset inward from the ends of the active area 130 (e.g., similar to the inward offset of the raised frame structures). The acoustic wave device 100 can also include the raised frame structure(s) 124, 126, or in some cases the raised frame structure(s) 124, 126 can be omitted. In some embodiments, the one or more trenches 172, 174 can be positioned in an edge region of the IDT electrode 108. The edge region can be a region within 0.45L from an edge of the active region 130.

Figure 45:
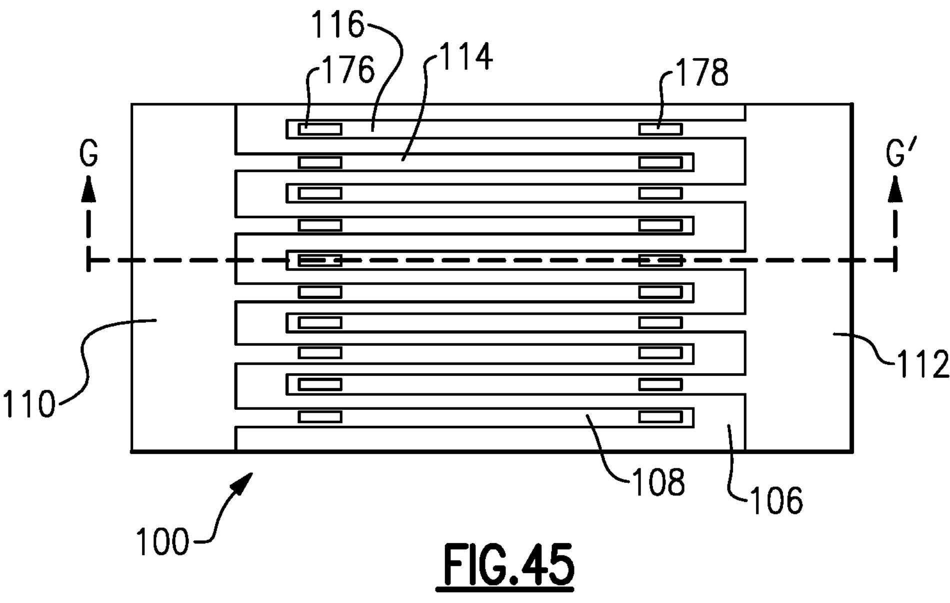
FIG. 45 is a schematic plan view of an example of an acoustic wave device.
Figure 46:
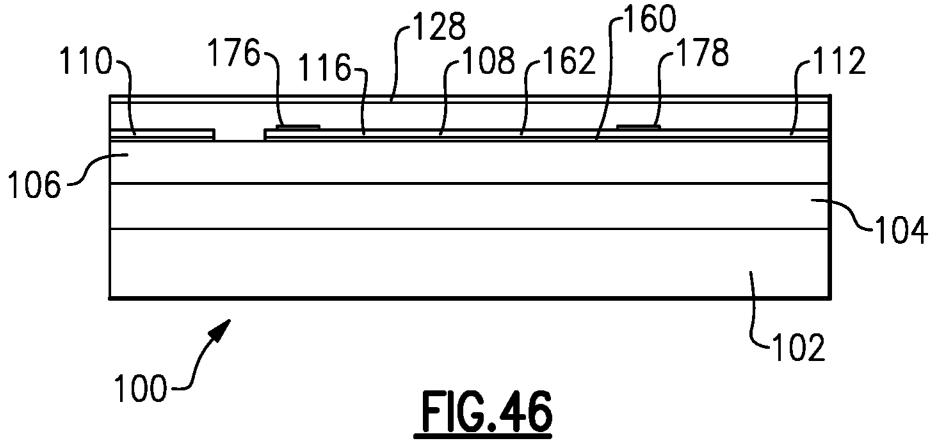
FIG. 46 is a schematic cross-sectional view of an example of an acoustic wave device.

FIG. 45 shows a schematic plan view of an example acoustic wave device 100, which can be similar to the other acoustic wave devices 100 disclosed herein, except as described. FIG. 46 shows a schematic cross-sectional view of the example acoustic wave device 100 taken through the line from G to G' in FIG. 45. The acoustic wave device 100 can have thickened portions on the IDT electrode 108, such as on the fingers 114, 116. Additional material 176 can be added at or near the ends of the fingers 114, 116. The additional material 176 can be aluminum, molybdenum, tungsten, or any other suitable material disclosed herein. The additional material 176 can be the same material as the IDT electrode 108, or a different material, such as with a higher acoustic impedance. In some cases, the second fingers 116 can have additional material 178 on locations of the stem portion 156 that align with the additional material 176 at the ends of the first fingers 114. The first fingers 114 can have additional material 178 that aligns with the additional material 176 at the ends of the second fingers 116. The acoustic wave device 100 can also include the raised frame structure (s) 124, 126, or in some cases the raised frame structure(s) 124, 126 can be omitted.

Figure 47:
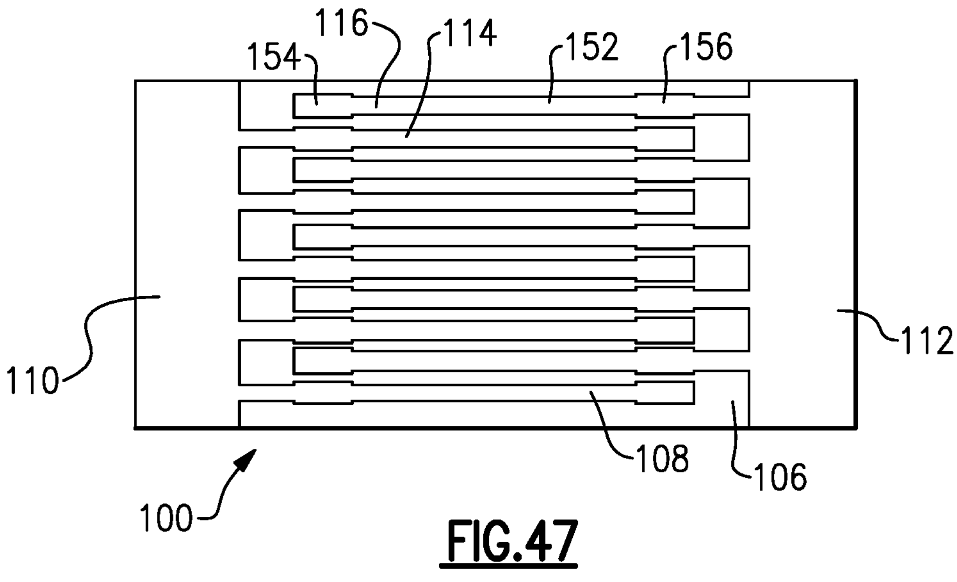
FIG. 47 is a schematic plan view of an example of an acoustic wave device.

FIG. 47 shows a schematic plan view of an example acoustic wave device 100, which can be similar to the other acoustic wave devices 100 disclosed herein, except that the IDT electrode 108 includes with hammerhead features. The fingers 114 and/or 116 can include a stem portion 152 and a head portion 154. The head portion 154 can be wider than the stem portion 152. The head portion 154 can be about 25%, about 30%, about 40%, about 50%, about 60%, about 70%, about 75%, about 80%, about 90%, about 100%, about 125%, about 150%, about 175%, about 200%, about 250%, or about 300% wider than the stem portion 152, or any values therebetween, or any ranges between any combination of these values, although other configurations are possible. The head portion 154 can be disposed at the end of the finger 114 or 116, such as the end closest to the opposing bus bar 112, 110. In some cases, the second fingers 116 can have widened stem portion 156 that align with the head portions 154 of the first fingers 114. The first fingers 114 can have widened stem portion 156 that align with the head portions 154 of the second fingers 116. The first raised frame portion 124 can at least partially overlap with the head portions 154 of the second arms 116. The second raised frame portion can at least partially overlap with the head portions 154 of the first fingers 114. The head portions 154 can have a length that is greater than a width of the corresponding raised frame structure 124, 126, and in some embodiments, a portion of the head portions 154 can extend past the raised frame structure 124 on one or both sides of the raised frame structure 124. In the embodiment of FIG. 47, the ends of the head portions 154 (e.g., furthest from the connection to the bus bar 110, 112) can extend past the edge of the raised frame structure 124, 126. In some embodiments, the raised frame portion 124, 126 can cover, or align substantially flush with, the ends of the corresponding fingers 116, 114. In some embodiments, the raised frame portions 124, 126 can cover the head portions 154 of the fingers 116, 114. In some embodiments, the raised frame structures 124, 126 can be omitted.

Figure 48:
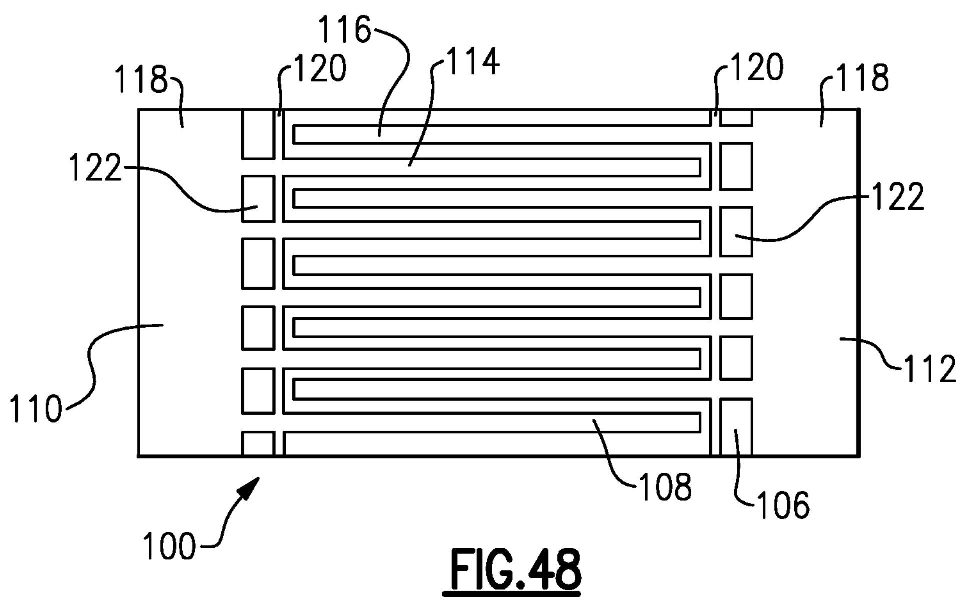
FIG. 48 is a schematic plan view of an example of an acoustic wave device.

FIG. 48 shows a schematic plan view of an example acoustic wave device 100, which can be similar to the other acoustic wave devices 100 disclosed herein, except as described. In some embodiments, the bus bar 110 and/or the bus bar 112 can include an outer or main bus bar section 118 and an inner or secondary bus bar section 120. The main bus bar section 118 can be disposed outward of the secondary bus bar section 120. The secondary bus bar section 120 can be disposed inward of the main bus bar section 118 (e.g., closer to the active region 130 or closer to the opposing fingers that extend from the opposing bus bar). The main bus bar section 118 can be wider than the secondary bus bar section 120, such as about 2 times wider, about 4 times wider, about 6 times wider, about 8 times wider, about 10 times wider, about 12 times wider, about 14 times wider, about 16 times wider, about 18 times wider, about 20 times wider, or any values or ranges between any of these numbers, although other configurations are possible. The secondary bus bar section 120 of the first bus bar 110 can interconnect the fingers 114 and/or the secondary bus bar section 120 of the second bus bar 112 can interconnect the fingers 116 of the second bus bar 114. The secondary bus bar 120 can be spaced apart from the main bus bar section 118 by a gap 122, which can be wider than the secondary bus bar section 120 and/or narrower than the main bus bar section 118. The gap 122 can be an opening through the conductive material or layer bound by the main bus bar section 118 one side, by the secondary bus bar section 120 on another side, and by fingers 114 or 116 on the other sides.

Figure 49:
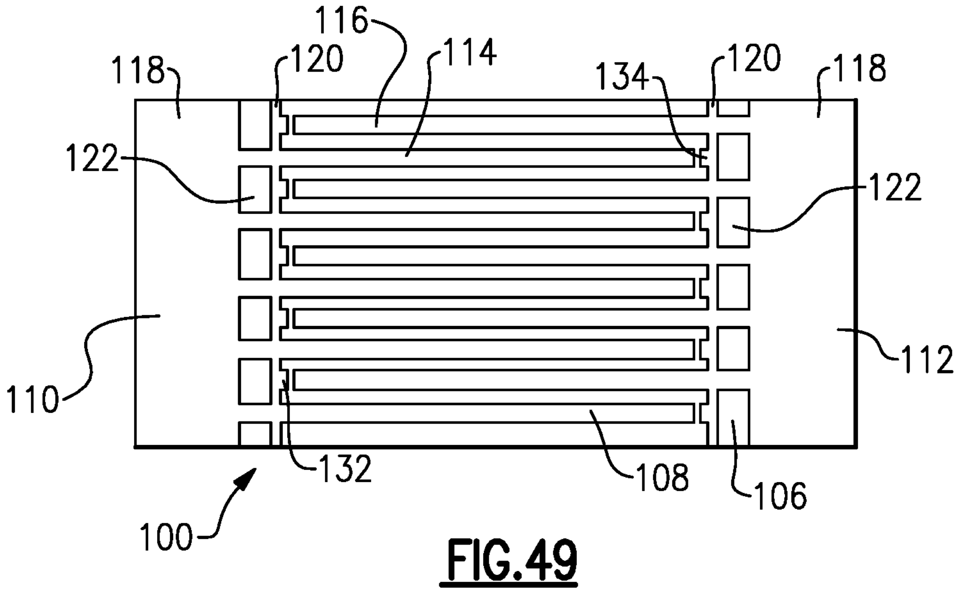
FIG. 49 is a schematic plan view of an example of an acoustic wave device.

FIG. 49 shows a schematic plan view of an example acoustic wave device 100, which can be similar to the other acoustic wave devices 100 disclosed herein, except as described. The IDT electrode 108 can include first dummy fingers 132, which can extend from the first bus bar 110 towards the fingers 116 or second bus bar 112. The first set of dummy fingers 132 can be positioned between corresponding first fingers 114. The first dummy fingers 132 can be shorter than the first fingers 114. The first dummy fingers 132 can be aligned with the opposing second fingers 116. The IDT electrode 108 can include second dummy fingers 134, which can extend from the second bus bar 112 towards the fingers 114 or first bus bar 112. The second set of dummy fingers 134 can be positioned between corresponding second fingers 116. The second dummy fingers 134 can be shorter than the second fingers 116. The second dummy fingers 134 can be aligned with the opposing first fingers 116. The dummy fingers 132, 134 can be used in combination with the secondary bus bar 120, as shown in FIG. 49, or they can be used with embodiments that do not have the secondary bus bar 120.

Figure 50:
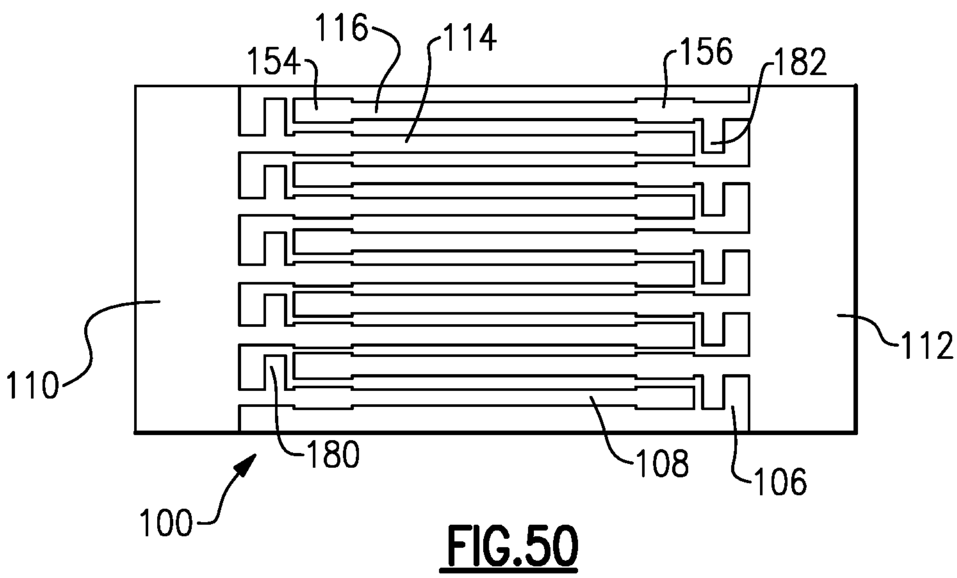
FIG. 50 is a schematic plan view of an example of an acoustic wave device.

FIG. 50 shows a schematic plan view of an example acoustic wave device 100, which can be similar to the other acoustic wave devices 100 disclosed herein, except as described. The IDT electrode 108 can include protrusions 180, 182 that extend from the fingers 114, 116, such as in a direction that is generally orthogonal to the direction that the fingers 114, 116 extend. The protrusions 180 can extend from a first side of the first fingers 114 and can extend towards the second side of an adjacent one of the first fingers 114, but without contacting the adjacent one of the first fingers 114. The protrusions 180 can extend in front of the ends of the second fingers 116. The protrusions 182 can extend from a first side of the second fingers 116 and can extend towards the second side of an adjacent one of the second fingers 116, but without contacting the adjacent one of the second fingers 116. The protrusions 182 can extend in front of the ends of the first fingers 114. The projections 180 and 182 can be structurally similar to the secondary bus bars 118 discussed herein, except that they do not extend fully between the adjacent first fingers 114 or adjacent second fingers 116. In FIG. 50, the projections 180 and 182 are shown in combination with the hammerhead structure on the fingers 114, 116. In other embodiments, the hammerhead structure can be omitted. The various other structures and features (e.g., the hammerhead structure, the raised frame structure, the passivation layer trench, the thickened fingers, the embedded strip, the piezoelectric trench or recesses, the secondary bus bar, the dummy fingers, and/or the projections) can also be combined in various combinations and subcombinations, and can be used with any suitable embodiments disclosed herein, such as with the LN piezoelectric layer 106, the overcoat layer 125, and/or the multi-layered IDT electrode, or any combination or subcombination thereof. Any of the acoustic wave devices 100 disclosed herein can be a SAW device or an MPS device. Various acoustic wave devices can have a passivation layer 128, as disclosed, or that passivation layer 128 can be omitted.

The resonator devices disclosed herein can be implemented in acoustic wave filters. In certain applications, the acoustic wave filters can be band pass filters arranged to pass a radio frequency band and attenuate frequencies outside of the radio frequency band. Two or more acoustic wave filters can be coupled together at a common node and arranged as a multiplexer, such as a duplexer.

Figure 51:
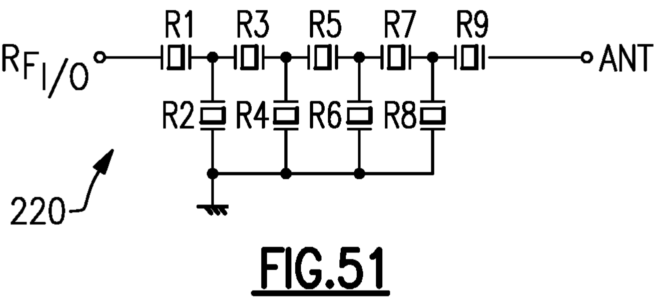
FIG. 51 is a schematic diagram of an example of an acoustic wave ladder filter.

FIG. 51 is a schematic diagram of an example of an acoustic wave ladder filter 220. The acoustic wave ladder filter 220 can be a transmit filter or a receive filter. The acoustic wave ladder filter 220 can be a band pass filter arranged to filter a radio frequency signal. The acoustic wave filter 220 can include series resonators R1, R3, R5, R7, and R9 and shunt resonators R2, R4, R6, and R8 coupled between a radio frequency input/output port RFI/O and an antenna port ANT. The radio frequency input/output port RFI/O can be a transmit port in a transmit filter or a receive port in a receive filter. One or more of the illustrated acoustic wave resonators can be a surface acoustic wave resonator in accordance with any suitable principles and advantages discussed herein. An acoustic wave ladder filter can include any suitable number of series resonators and any suitable number of shunt resonators.

An acoustic wave filter can be arranged in any other suitable filter topology, such as a lattice topology or a hybrid ladder and lattice topology. A surface acoustic wave resonator in accordance with any suitable principles and advantages disclosed herein can be implemented in a band pass filter. In some other applications, a surface acoustic wave resonator in accordance with any suitable principles and advantages disclosed herein can be implemented in a band stop filter.

Figure 52:
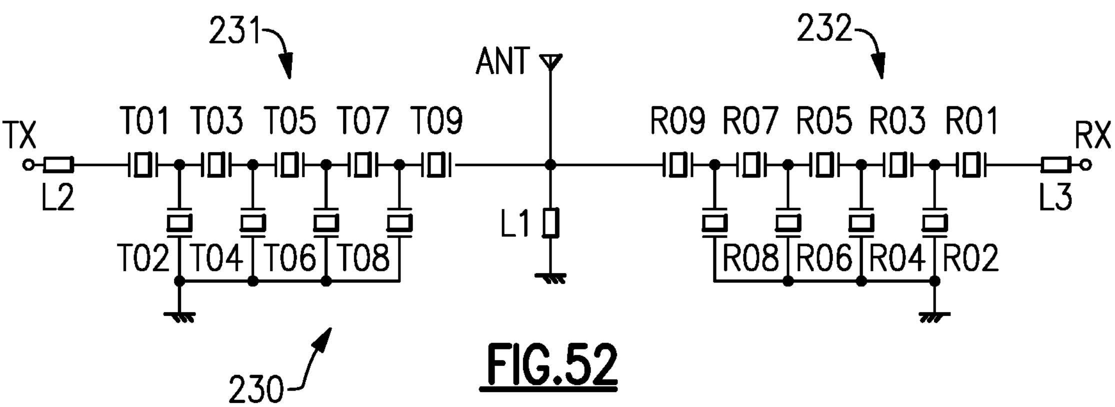
FIG. 52 is a schematic diagram of an example of a duplexer.

FIG. 52 is a schematic diagram of an example of a duplexer 230. The duplexer 230 can include a transmit filter 231 and a receive filter 232 coupled to each other at an antenna node ANT. A shunt inductor L1 can be connected to the antenna node ANT. The transmit filter 231 and the receive filter 232 can both be acoustic wave ladder filters in the duplexer 230.

The transmit filter 231 can filter a radio frequency signal and provide a filtered radio frequency signal to the antenna node ANT. A series inductor L2 can be coupled between a transmit input node TX and the acoustic wave resonators of the transmit filter 231. The illustrated transmit filter 231 can include acoustic wave resonators T01 to T09. One or more of these resonators can be surface acoustic wave resonator in accordance with any suitable principles and advantages disclosed herein. The illustrated receive filter can include acoustic wave resonators R01 to R09. One or more of these resonators can be a surface acoustic wave resonator in accordance with any suitable principles and advantages disclosed herein. The receive filter can filter a radio frequency signal received at the antenna node ANT. A series inductor L3 can be coupled between the resonator and a receive output node RX. The receive output node RX of the receive filter provides a radio frequency receive signal.

Figure 53:
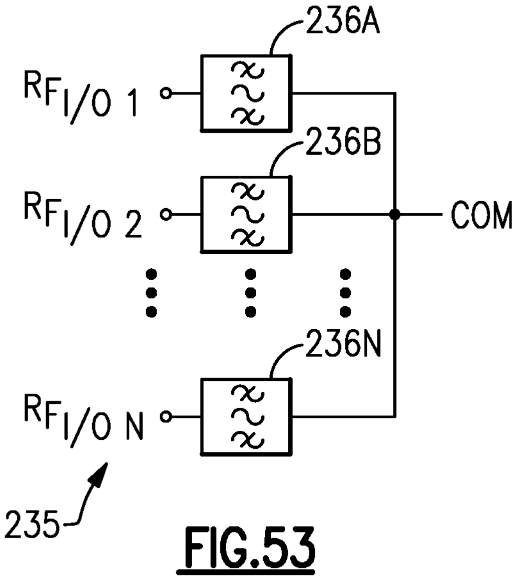
FIG. 53 is a schematic diagram of an example of a multiplexer.

FIG. 53 is a schematic diagram of a multiplexer 235 that includes an acoustic wave filter according to an embodiment. The multiplexer 235 can include a plurality of filters 236A to 236N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. Each of the illustrated filters 236A, 236B, and 236N can be coupled between the common node COM and a respective input/output node RFI/O1, RFI/O2, and RFI/ON.

In some instances, all filters of the multiplexer 235 can be receive filters. According to some other instances, all filters of the multiplexer 235 can be transmit filters. In various applications, the multiplexer 235 can include one or more transmit filters and one or more receive filters. Accordingly, the multiplexer 235 can include any suitable number of transmit filters and any suitable number of receive filters. Each of the illustrated filters can be band pass filters having different respective pass bands.

The multiplexer 235 is illustrated with hard multiplexing with the filters 236A to 236N having fixed connections to the common node COM. In some other applications, one or more of the filters of a multiplexer can be electrically connected to the common node by a respective switch. Any of such filters can include a surface acoustic wave resonator according to any suitable principles and advantages disclosed herein.

A first filter 236A can be an acoustic wave filter having a first pass band and arranged to filter a radio frequency signal. The first filter 236A can include one or more surface acoustic wave resonators according to any suitable principles and advantages disclosed herein. A second filter 236B has a second pass band. In some embodiments, a raised frame structure of one or more surface acoustic wave resonators of the first filter 236A can move a raised frame mode of the one or more surface acoustic wave resonators away from the second passband. This can increase a reflection coefficient (Gamma) of the first filter 236A in the pass band of the second filter 236B. The raised frame structure of the surface acoustic wave resonator of the first filter 236A can also move the raised frame mode away from the passband of one or more other filters of the multiplexer 235.

In certain instances, the common node COM of the multiplexer 235 can be arranged to receive a carrier aggregation signal including at least a first carrier associated with the first passband of the first filter 236A and a second carrier associated with the second passband of the second filter 236B. A multi-layer raised frame structure of a surface acoustic wave resonator of the first filter 236A can maintain and/or increase a reflection coefficient of the first filter 236A in the second passband of the second filter 236B that is associated with the second carrier of the carrier aggregation signal.

The filters 236B to 236N of the multiplexer 235 can include one or more acoustic wave filters, one or more acoustic wave filters that include at least one surface acoustic wave resonator with a raised frame structure, one or more LC filters, one or more hybrid acoustic wave LC filters, or any suitable combination thereof.

The acoustic wave resonators disclosed herein can be implemented in a variety of packaged modules. Some example packaged modules will now be discussed in which any suitable principles and advantages of the surface acoustic wave devices disclosed herein can be implemented. The example packaged modules can include a package that encloses the illustrated circuit elements. The illustrated circuit elements can be disposed on a common packaging substrate. The packaging substrate can be a laminate substrate, for example. FIGS. 54, 55A, 55B, and 56 are schematic block diagrams of illustrative packaged modules according to certain embodiments. Certain example packaged modules can include one or more radio frequency amplifiers, such as one or more power amplifiers and/or one or more low noise amplifiers. Any suitable combination of features of these modules can be implemented with each other. While duplexers are illustrated in the example packaged modules of FIGS. 54, 55A, and 56, any other suitable multiplexer that includes a plurality of acoustic wave filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

FIG. 54 is a schematic block diagram of an example module 240 that includes duplexers 241A to 241N and an antenna switch 242. One or more filters of the duplexers 241A to 241N can include any suitable number acoustic wave resonators in accordance with any suitable principles and advantages discussed herein. Any suitable number of duplexers 241A to 241N can be implemented. The antenna switch 242 can have a number of throws corresponding to the number of duplexers 241A to 241N. The antenna switch 242 can electrically couple a selected duplexer to an antenna port of the module 240.

FIG. 55A is a schematic block diagram of an example module 250 that includes a power amplifier 253, a radio frequency switch 257, and duplexers 241A to 241N in accordance with one or more embodiments. The power amplifier 253 can amplify a radio frequency signal. The radio frequency switch 257 can be a multi-throw radio frequency switch. The radio frequency switch 257 can electrically couple an output of the power amplifier 253 to a selected transmit filter of the duplexers 241A to 241N. One or more filters of the duplexers 241A to 241N can include any suitable number of surface acoustic wave resonators in accordance with any suitable principles and advantages discussed herein. Any suitable number of duplexers 241A to 241N can be implemented.

FIG. 55B is a schematic block diagram of an example module 255 that includes filters 256A to 256N, a radio frequency switch 257, and a low noise amplifier 258 according to one or more embodiments. One or more filters of the filters 256A to 256N can include any suitable number of surface acoustic wave resonators in accordance with any suitable principles and advantages disclosed herein. Any suitable number of filters 256A to 256N can be implemented. The illustrated filters 256A to 256N can be receive filters. In some embodiments (not illustrated), one or more of the filters 256A to 256N can be included in a multiplexer that also includes a transmit filter. The radio frequency switch 257 can be a multi-throw radio frequency switch. The radio frequency switch 257 can electrically couple an output of a selected filter of filters 256A to 256N to the low noise amplifier 258. In some embodiments (not illustrated), a plurality of low noise amplifiers can be implemented. The module 255 can include diversity receive features in certain applications.

FIG. 56 is a schematic block diagram of an example module 260 that includes a power amplifier 253, a radio frequency switch 257, and a duplexer 241 that includes surface acoustic wave device in accordance with one or more embodiments, and an antenna switch 242. The module 260 can include elements of the module 240 and elements of the module 250.

Figure 57A:
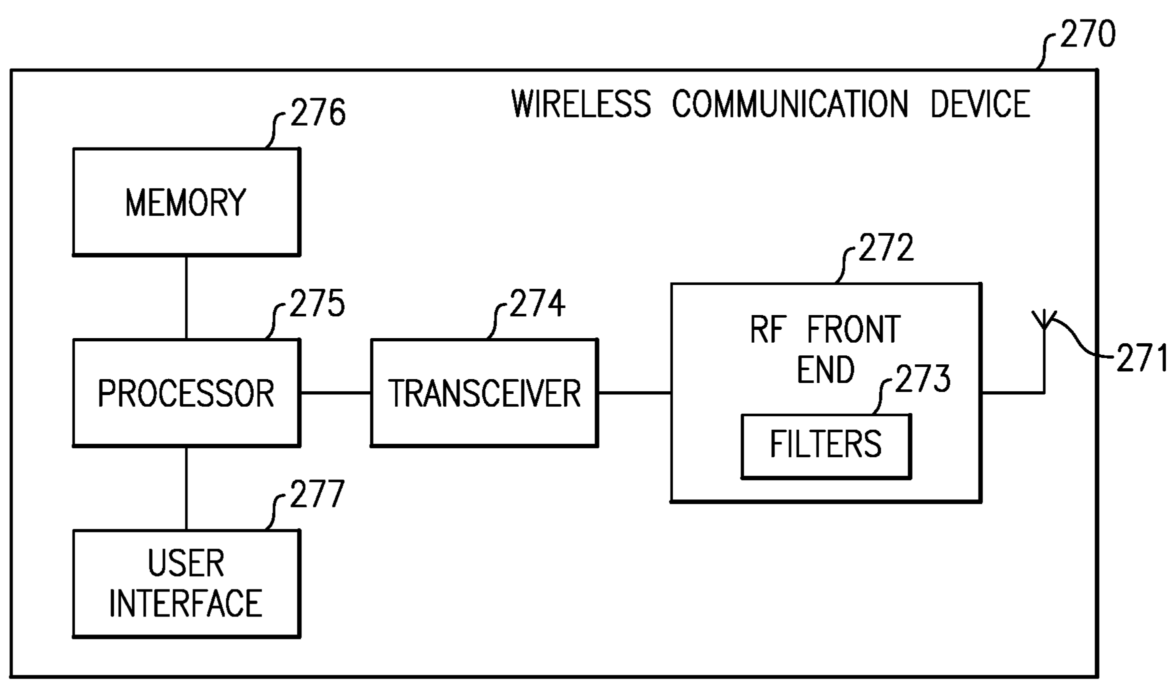
FIG. 57A is a schematic block diagram of a wireless communication device that includes filters that include one or more acoustic wave devices.

One or more filters with any suitable number of surface acoustic devices can be implemented in a variety of wireless communication devices. FIG. 57A is a schematic block diagram of an example wireless communication device 270 that includes a filter 273 with one or more acoustic wave resonators in accordance with any suitable principles and advantages disclosed herein. The wireless communication device 270 can be any suitable wireless communication device. For instance, a wireless communication device 270 can be a mobile phone, such as a smart phone. As illustrated, the wireless communication device 270 includes an antenna 271, a radio frequency (RF) front end 272 that includes filter 273, an RF transceiver 274, a processor 275, a memory 276, and a user interface 277. The antenna 271 can transmit RF signals provided by the RF front end 272. The antenna 271 can provide received RF signals to the RF front end 272 for processing.

The RF front end 272 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 272 can transmit and receive RF signals associated with any suitable communication standards. Any of the acoustic wave resonators disclosed herein can be implemented in filters 273 of the RF front end 272.

The RF transceiver 274 can provide RF signals to the RF front end 272 for amplification and/or other processing. The RF transceiver 274 can also process an RF signal provided by a low noise amplifier of the RF front end 272. The RF transceiver 274 is in communication with the processor 275. The processor 275 can be a baseband processor. The processor 275 can provide any suitable base band processing functions for the wireless communication device 270. The memory 276 can be accessed by the processor 275. The memory 276 can store any suitable data for the wireless communication device 270. The processor 275 is also in communication with the user interface 277. The user interface 277 can be any suitable user interface, such as a display.

Figure 57B:
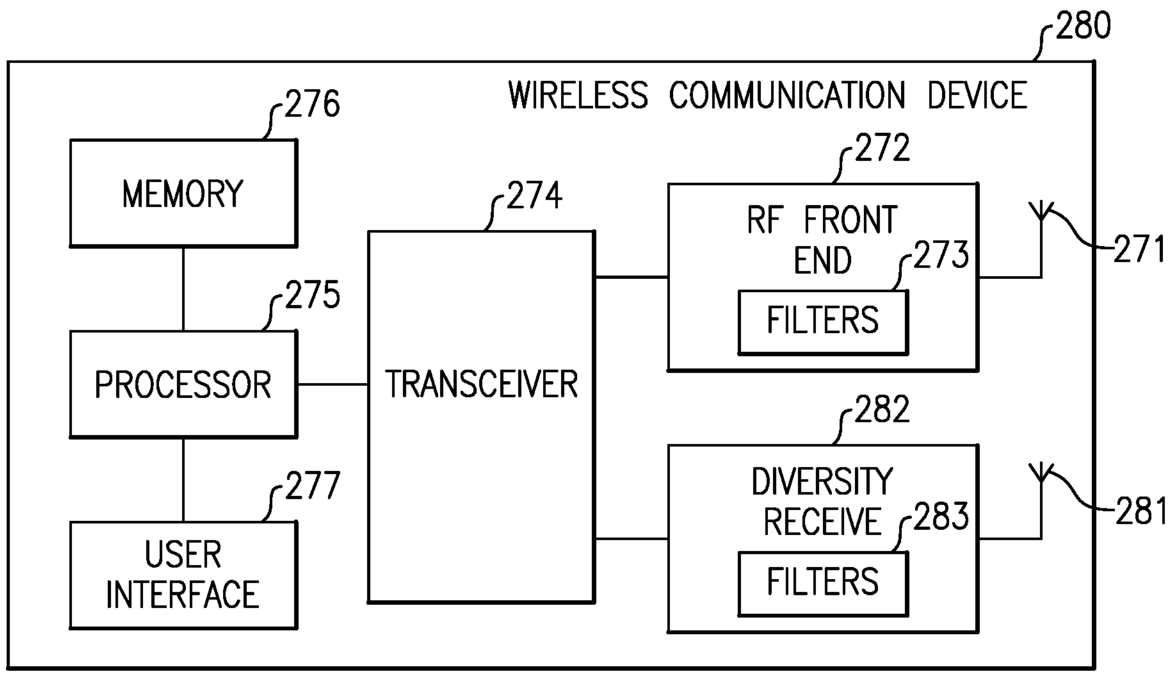
FIG. 57B is a schematic block diagram of another wireless communication device that includes filters that include one or more acoustic wave devices.

FIG. 57B is a schematic diagram of a wireless communication device 280 that includes filters 273 in a radio frequency front end 272 and second filters 283 in a diversity receive module 282. The wireless communication device 280 is like the wireless communication device 270 of FIG. 57A, except that the wireless communication device 280 also includes diversity receive features. As illustrated in FIG. 57B, the wireless communication device 280 can include a diversity antenna 281, a diversity module 282 configured to process signals received by the diversity antenna 281 and including filters 283, and a transceiver 274 in communication with both the radio frequency front end 272 and the diversity receive module 282. One or more of the second filters 283 can include a surface acoustic wave resonator in accordance with any suitable principles and advantages disclosed herein.

Acoustic wave devices disclosed herein can be included in a filter and/or a multiplexer arranged to filter a radio frequency signal in a fifth generation (5G) New Radio (NR) operating band within Frequency Range 1 (FR1). FR1 can from 410 megahertz (MHz) to 7.125 gigahertz (GHz), for example, as specified in a current 5G NR specification. A filter arranged to filter a radio frequency signal in a 5G NR FR1 operating band can include one or more acoustic wave resonators be implemented in accordance with any suitable principles and advantages disclosed herein.

5G NR carrier aggregation specifications can present technical challenges. For example, 5G carrier aggregations can have wider bandwidth and/or channel spacing than fourth generation (4G) Long Term Evolution (LTE) carrier aggregations. Carrier aggregation bandwidth in certain 5G FR1 applications can be in a range from 120 MHz to 400 MHz, such as in a range from 120 MHz to 200 MHz. Carrier spacing in certain 5G FR1 applications can be up to 100 MHz. Acoustic wave resonators as disclosed herein can have improved heat management, in some embodiments.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

While certain embodiments have been described, these embodiments have been presented by way of example only, and are not intended to limit the scope of the disclosure. Indeed, the novel resonators, devices, modules, apparatus, methods, and systems described herein may be embodied in a variety of other forms. Furthermore, various omissions, substitutions and changes in the form of the resonators, devices, modules, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave device configured to generate a surface acoustic wave having a wavelength L, the acoustic wave device comprising:

- a substrate;
- a piezoelectric layer including lithium niobate, the piezoelectric layer having a trench in an edge region within 0.25L and 0.45L from an edge of an active region where the surface acoustic wave is generated;
- an interdigital transducer electrode, the piezoelectric layer disposed at least partially between the substrate and the interdigital transducer electrode;
- an overcoat dielectric layer over the interdigital transducer electrode; and
- a raised frame structure over the overcoat dielectric layer, the raised frame structure positioned in the edge region of the active region, and the raised frame structure has a height in a range between 0.08L and 0.16L.

2. The acoustic wave device of claim 1 wherein the raised frame structure includes a material of the overcoat dielectric layer.

3. The acoustic wave device of claim 1 wherein the overcoat dielectric layer has a height in a range between 0.05L and 0.35 L.

4. The acoustic wave device of claim 1 wherein the piezoelectric layer includes R rotated Y-cut X-propagation lithium niobate with R between 0 degrees and 45 degrees.

5. The acoustic wave device of claim 1 wherein the piezoelectric layer includes R rotated Y-cut X-propagation lithium niobate with R between about 15 degrees and about 40 degrees.

6. The acoustic wave device of claim 1 wherein the raised frame structure has a width in a range between 0.5L and 1.5L.

7. The acoustic wave device of claim 1 wherein the raised frame structure has a height in a range between 0.1L and 0.14L.

8. An acoustic wave device 1 configured to generate a surface acoustic wave having a wavelength L, the acoustic wave device comprising:

- a substrate;
- a piezoelectric layer including lithium niobate, the piezoelectric layer having a trench in an edge region within 0.25L and 0.45L from an edge of an active region where the surface acoustic wave is generated;
- an interdigital transducer electrode, the piezoelectric layer disposed at least partially between the substrate and the interdigital transducer electrode;
- an overcoat dielectric layer over the interdigital transducer electrode; and
- a raised frame structure over the overcoat dielectric layer, the raised frame structure positioned in the edge region of the active region, and the raised frame structure is offset inward from the edge of the active region by an offset distance in a range between 0.05L and 0.3L.

9. The acoustic wave device of claim 8 wherein the interdigital transducer electrode includes a first layer and a second layer, the first layer disposed between the second layer and the piezoelectric layer, and the second layer disposed between the first layer and the overcoat dielectric layer.

10. The acoustic wave device of claim 9 wherein the first layer includes molybdenum and the second layer includes aluminum.

11. The acoustic wave device of claim 9 wherein the first layer includes tungsten and the second layer includes aluminum.

12. The acoustic wave device of claim 8 wherein the raised frame structure is offset inward from the edge of the active region by an offset distance in a range between 0.1L and 0.2L.

13. The acoustic wave device of claim 8 further comprising an intervening dielectric layer between the substrate and the piezoelectric layer, and a trap-rich layer between the substrate and the intervening dielectric layer.

14. An acoustic wave device configured to generate a surface acoustic wave having a wavelength L, the acoustic wave device comprising:

- a multilayer piezoelectric substrate including a support substrate, a trap-rich layer over the support substrate, an intervening dielectric layer over the trap-rich layer, and a piezoelectric layer, the piezoelectric layer including lithium niobate;
- an interdigital transducer electrode formed with the piezoelectric layer;
- an overcoat dielectric layer over the interdigital transducer electrode, the overcoat dielectric layer including silicon oxide; and
- a raised frame structure over the overcoat dielectric layer, the raised frame structure positioned in an edge region within 0.25L and 0.45L from an edge of an active region where the surface acoustic wave is generated, and the raised frame structure has a height in a range between 0.08L and 0.16L.

15. The acoustic wave device of claim 14 wherein the piezoelectric layer having a trench in the edge region of the active region.

16. The acoustic wave device of claim 14 wherein the raised frame structure includes a material of the overcoat dielectric layer.

17. An acoustic wave device configured to generate a surface acoustic wave having a wavelength L, the acoustic wave device comprising:

a substrate;

a piezoelectric layer including lithium niobate, the piezoelectric layer having a trench in an edge region within 0.25L and 0.45L from an edge of an active region where the surface acoustic wave is generated;

an interdigital transducer electrode, the piezoelectric layer disposed at least partially between the substrate and the interdigital transducer electrode;

an overcoat dielectric layer over the interdigital transducer electrode; and a raised frame structure over the overcoat dielectric layer, the raised frame structure positioned in the edge region of the active region, and the raised frame structure has a width in a range between 0.5L and 1.5L.

18. The acoustic wave device of claim 17 wherein the raised frame structure has a width in a range between 0.7L and 0.8L.

19. A radio frequency device comprising:

an acoustic wave device configured to generate a surface acoustic wave having a wavelength L, the acoustic wave device including a piezoelectric layer including lithium niobate, an interdigital transducer electrode over the piezoelectric layer, an overcoat dielectric layer over the interdigital transducer electrode, and a raised frame structure over the overcoat dielectric layer, the piezoelectric layer having a trench in an edge region within 0.25L and 0.45L from an edge of an active region where the surface acoustic wave is generated, the raised frame structure positioned in the edge region of the active region, the raised frame structure has a height in a range between 0.08L and 0.16L and the raised frame structure is offset from the edge of the active region; and an antenna electrically coupled with the acoustic wave device.

20. The radio frequency device of claim 19 wherein the raised frame structure has a width in a range between 0.5L and 1.5L.

* * * * *